(12) United States Patent
Lin et al.

(10) Patent No.: US 9,202,769 B2
(45) Date of Patent: Dec. 1, 2015

(54) SEMICONDUCTOR DEVICE AND METHOD OF FORMING THERMAL LID FOR BALANCING WARPAGE AND THERMAL MANAGEMENT

(71) Applicant: STATS ChipPAC, Ltd., Singapore (SG)

(72) Inventors: Yaojian Lin, Singapore (SG); Pandi C. Marimuthu, Singapore (SG); Il Kwon Shim, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 14/509,785

(22) Filed: Oct. 8, 2014

(65) Prior Publication Data
US 2015/0021754 A1    Jan. 22, 2015

Related U.S. Application Data

(60) Continuation-in-part of application No. 13/231,789, filed on Sep. 13, 2011, now Pat. No. 8,912,648, which is a division of application No. 12/625,975, filed on Nov. 25, 2009, now Pat. No. 8,034,661.

(51) Int. Cl.
*H01L 21/44* (2006.01)
*H01L 23/367* (2006.01)
(Continued)

(52) U.S. Cl.
CPC ........... *H01L 23/367* (2013.01); *H01L 21/568* (2013.01); *H01L 21/6835* (2013.01); *H01L 23/16* (2013.01); *H01L 23/3121* (2013.01); *H01L 23/3128* (2013.01); *H01L 23/5389* (2013.01); *H01L 23/552* (2013.01); *H01L 23/562* (2013.01); *H01L 24/19* (2013.01);

*H01L 24/20* (2013.01); *H01L 24/96* (2013.01); *H01L 24/97* (2013.01); *H01L 23/42* (2013.01);
(Continued)

(58) Field of Classification Search
CPC ........... H01L 2924/01079; H01L 2924/15311; H01L 2924/01029; H01L 2924/01078; H01L 2224/16
USPC ................... 438/122, 124; 257/706, 723, 730
See application file for complete search history.

(56) References Cited

U.S. PATENT DOCUMENTS

| 5,250,843 A | 10/1993 | Eichelberger |
| 5,353,498 A | 10/1994 | Fillion et al. |

(Continued)

FOREIGN PATENT DOCUMENTS

| CN | 1158006 A | 8/1997 |
| CN | 1996575 A | 7/2007 |

*Primary Examiner* — Quoc Hoang
(74) *Attorney, Agent, or Firm* — Robert D. Atkins; Patent Law Group: Atkins and Associates, P.C.

(57) ABSTRACT

A semiconductor device has a first semiconductor die and an encapsulant deposited over the first semiconductor die. An interconnect structure is formed over the first semiconductor die and encapsulant. A thermal interface material is formed over the first semiconductor die and encapsulant. A stiffening layer is formed over the first semiconductor die and an edge portion of the encapsulant. Alternatively, an insulating layer is formed adjacent to the first semiconductor die and a stiffening layer is formed over the insulating layer. The stiffening layer includes metal, ferrite, ceramic, or semiconductor material. A heat spreader is disposed over the first semiconductor die and a central portion of the encapsulant. Openings are formed in the heat spreader. A recess is formed in the heat spreader along an edge of the heat spreader. A coefficient of thermal expansion (CTE) of the stiffening layer is less than a CTE of the heat spreader.

21 Claims, 30 Drawing Sheets

(51) Int. Cl.
- *H01L 23/00* (2006.01)
- *H01L 23/16* (2006.01)
- *H01L 23/31* (2006.01)
- *H01L 21/56* (2006.01)
- *H01L 23/552* (2006.01)
- *H01L 21/683* (2006.01)
- *H01L 23/538* (2006.01)
- H01L 23/42 (2006.01)
- H01L 23/498 (2006.01)

(52) U.S. Cl.
CPC ..... *H01L23/49811* (2013.01); *H01L 23/49822* (2013.01); *H01L 2224/0401* (2013.01); *H01L 2224/04105* (2013.01); *H01L 2224/12105* (2013.01); *H01L 2224/16225* (2013.01); *H01L 2224/20* (2013.01); *H01L 2224/73267* (2013.01); *H01L 2224/9222* (2013.01); *H01L 2224/94* (2013.01); *H01L 2224/97* (2013.01); *H01L 2924/01004* (2013.01); *H01L 2924/014* (2013.01); *H01L 2924/01005* (2013.01); *H01L 2924/01006* (2013.01); *H01L 2924/01013* (2013.01); *H01L 2924/01029* (2013.01); *H01L 2924/01033* (2013.01); *H01L 2924/01047* (2013.01); *H01L 2924/01073* (2013.01); *H01L 2924/01078* (2013.01); *H01L 2924/01079* (2013.01); *H01L 2924/01082* (2013.01); *H01L 2924/01322* (2013.01); *H01L 2924/09701* (2013.01); *H01L 2924/12041* (2013.01); *H01L 2924/1306* (2013.01); *H01L 2924/13091* (2013.01); *H01L 2924/14* (2013.01); *H01L 2924/1433* (2013.01); *H01L 2924/15174* (2013.01); *H01L 2924/15311* (2013.01); *H01L 2924/18162* (2013.01); *H01L 2924/19041* (2013.01); *H01L 2924/19105* (2013.01); *H01L 2924/3025* (2013.01); *H01L 2924/30105* (2013.01)

(56) References Cited

U.S. PATENT DOCUMENTS

| | | | |
|---|---|---|---|
| 5,533,256 A * | 7/1996 | Call et al. | 29/840 |
| 5,835,355 A | 11/1998 | Dordi | |
| 5,841,193 A | 11/1998 | Eichelberger | |
| 5,866,952 A | 2/1999 | Wojnarowski et al. | |
| 6,011,304 A * | 1/2000 | Mertol | 257/706 |
| 7,015,577 B2 * | 3/2006 | Wang | 257/707 |
| 7,432,601 B2 | 10/2008 | Chen | |
| 7,445,957 B2 | 11/2008 | Huang et al. | |
| 7,619,901 B2 | 11/2009 | Eichelberger et al. | |
| 7,745,260 B2 | 6/2010 | Lo | |
| 8,013,438 B2 * | 9/2011 | Luan et al. | 257/707 |
| 8,021,930 B2 | 9/2011 | Pagaila | |
| 8,034,661 B2 | 10/2011 | Lin et al. | |
| 2007/0278671 A1 | 12/2007 | Fan | |
| 2008/0083992 A1 | 4/2008 | Lin et al. | |
| 2008/0093748 A1 | 4/2008 | Chen | |
| 2008/0237855 A1 | 10/2008 | Fan et al. | |
| 2009/0065927 A1 | 3/2009 | Meyer | |
| 2009/0096093 A1 | 4/2009 | Yang et al. | |
| 2009/0108440 A1 | 4/2009 | Meyer et al. | |
| 2010/0035384 A1 | 2/2010 | Eichelberger et al. | |

* cited by examiner

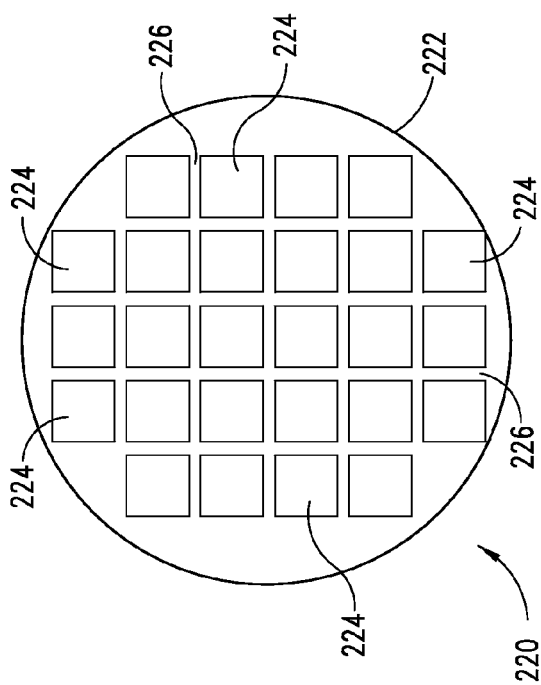
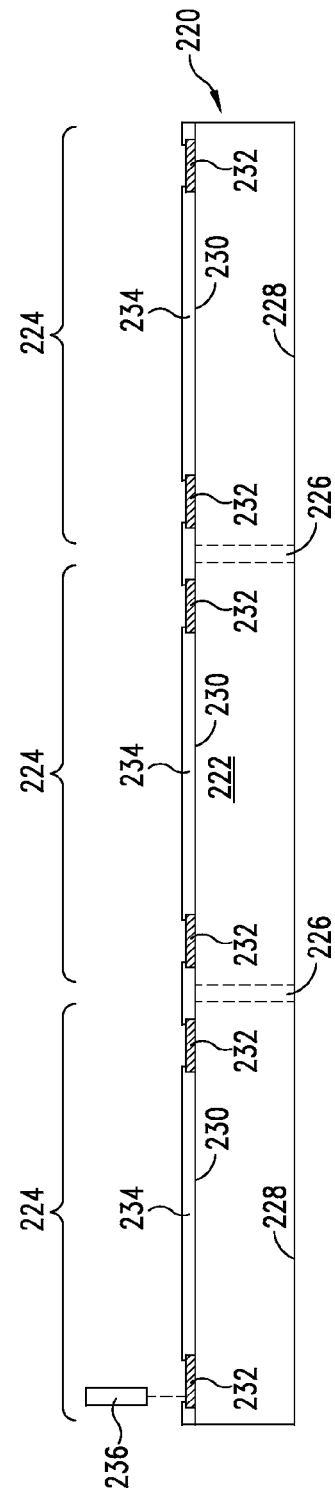

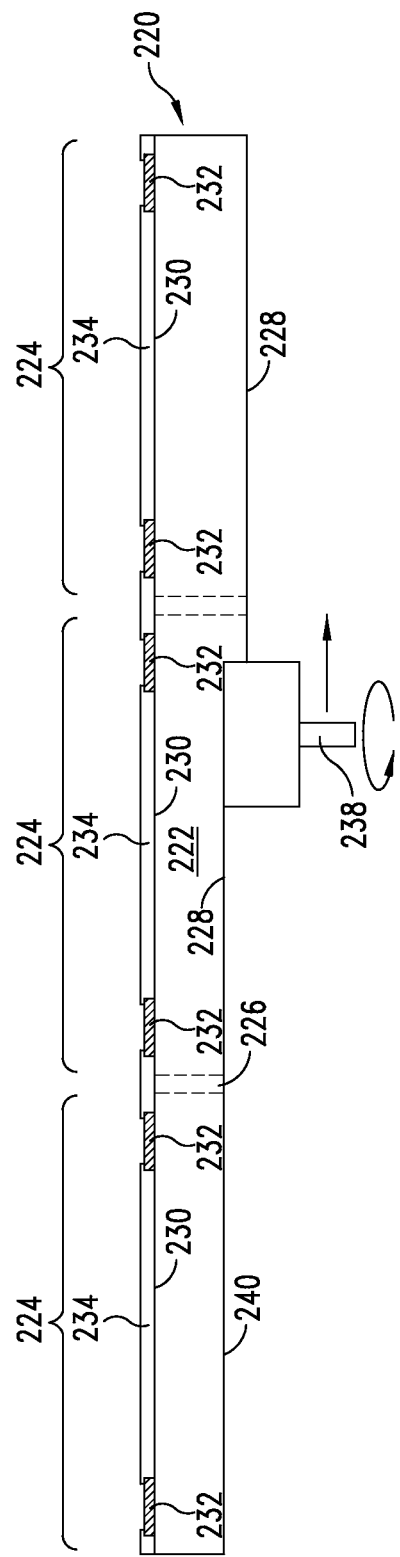

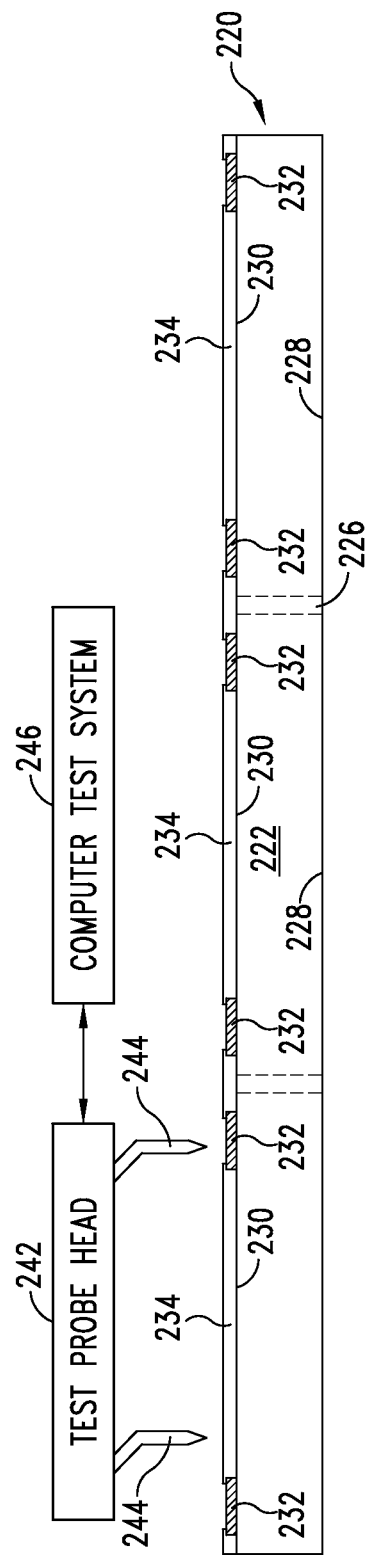
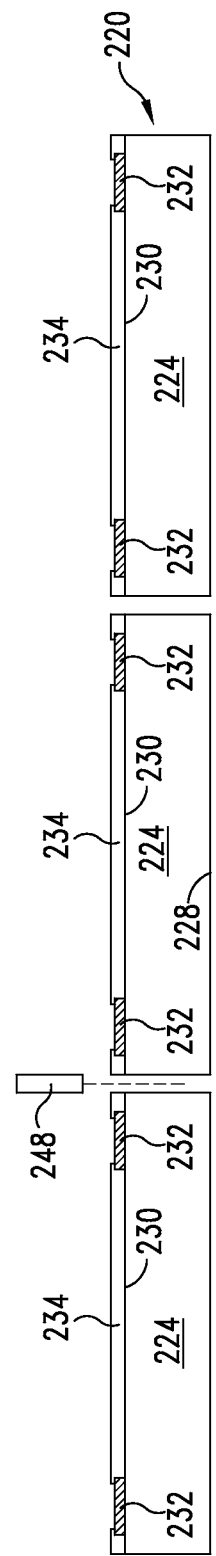
FIG. 11d
FIG. 11e

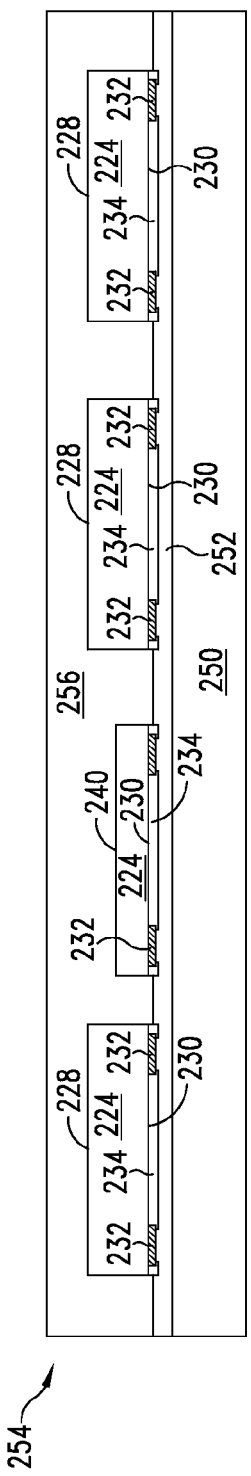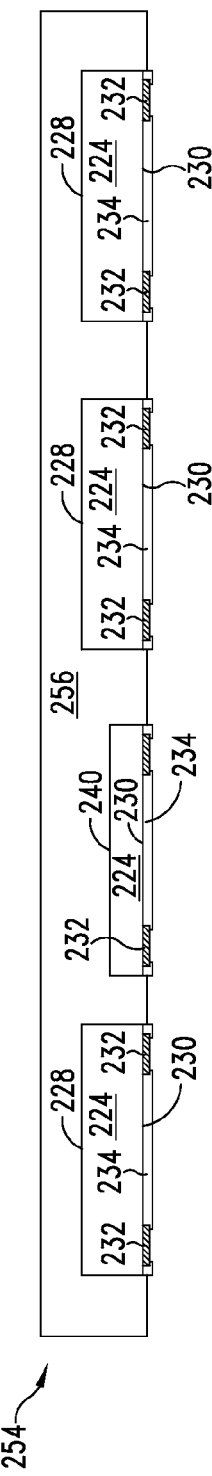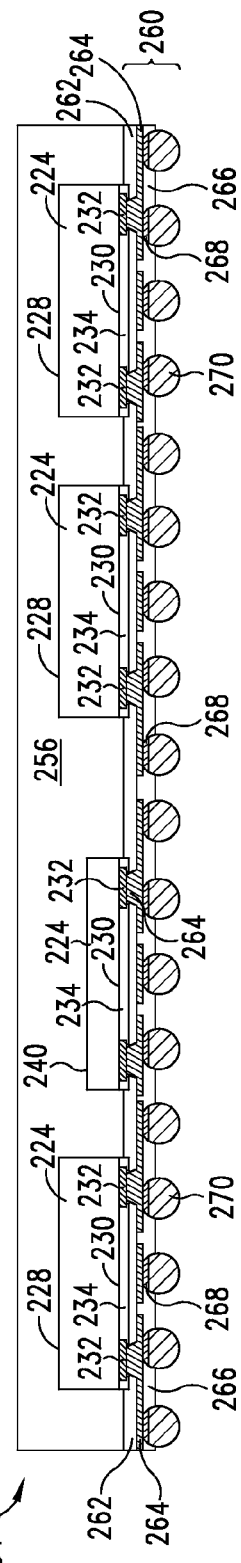

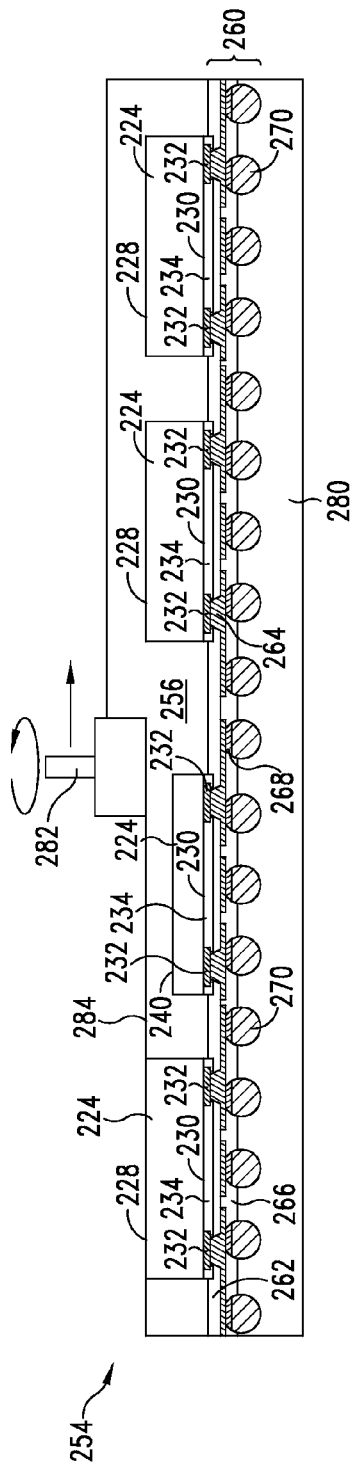
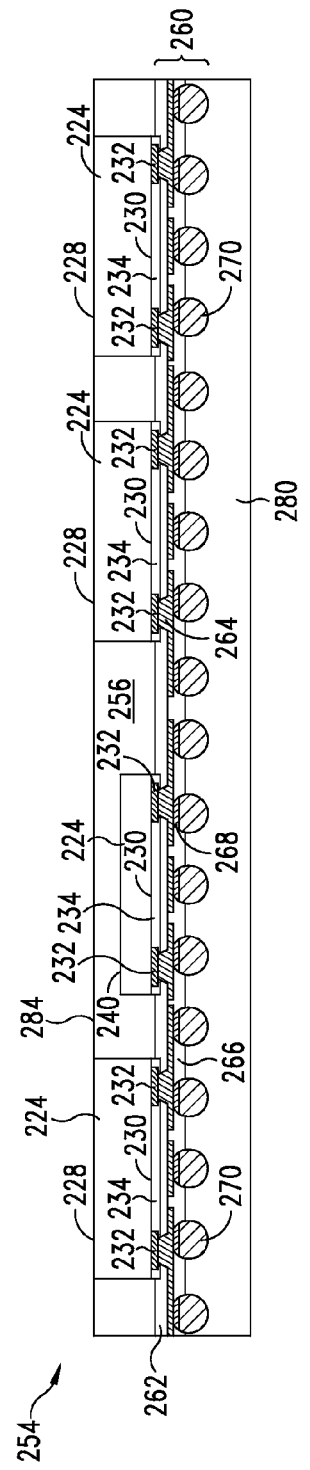

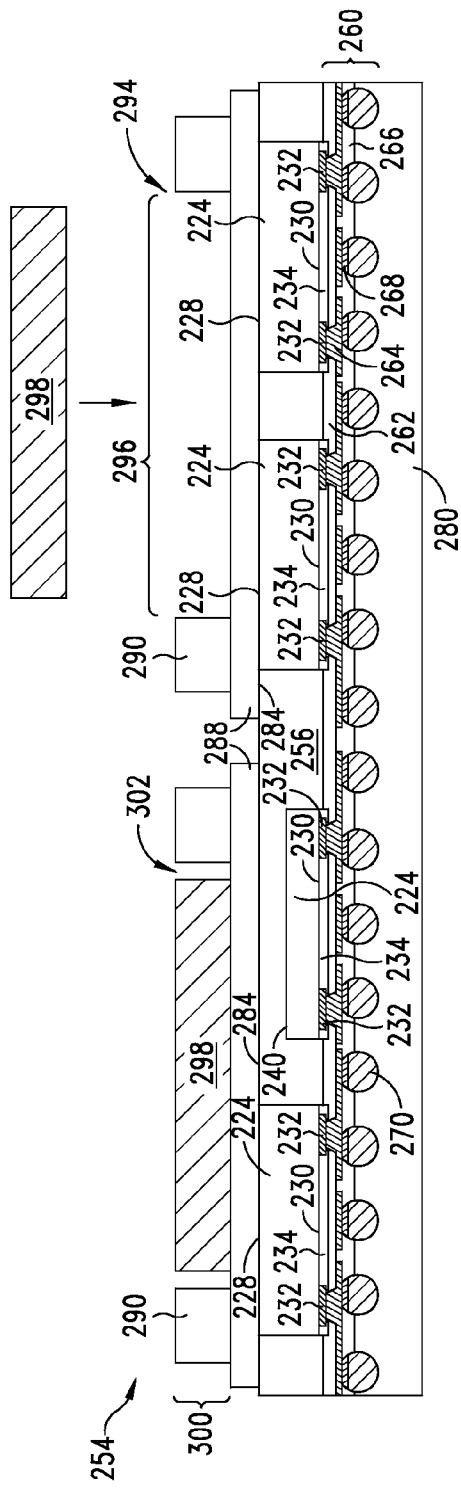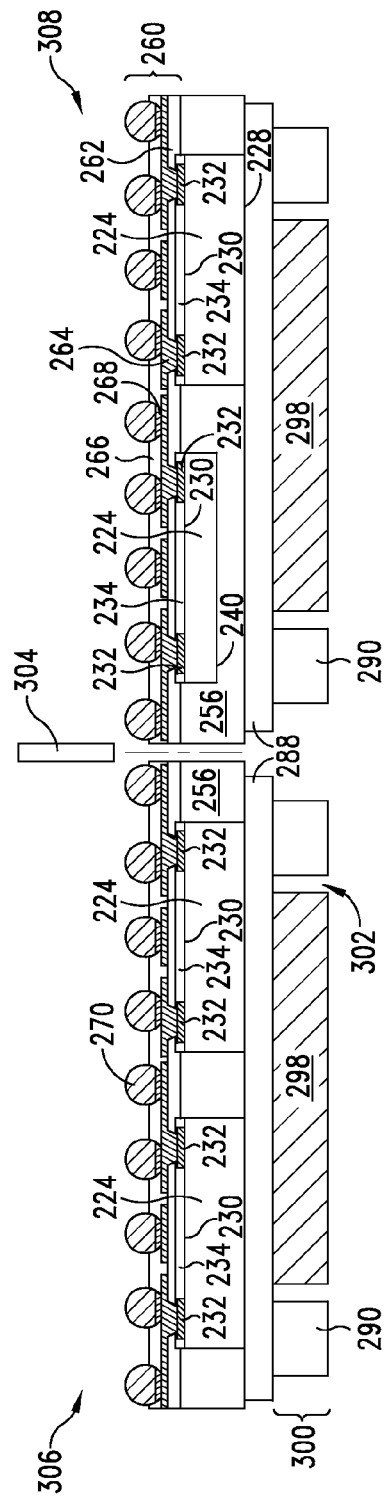
FIG. 12i
FIG. 12j

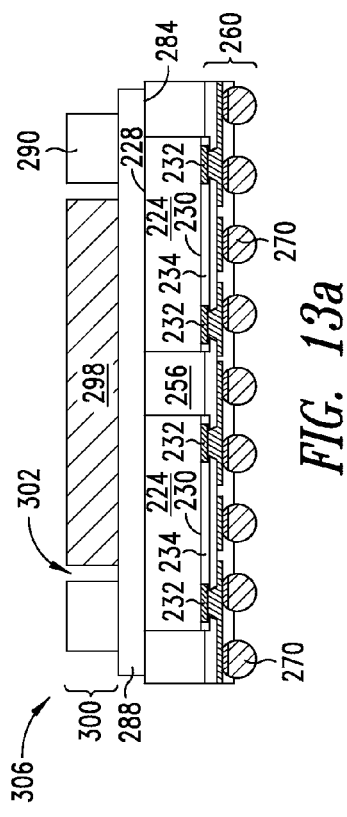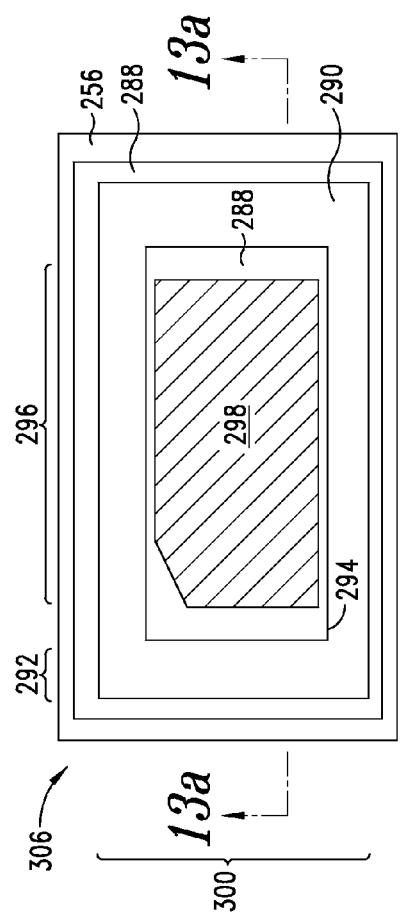

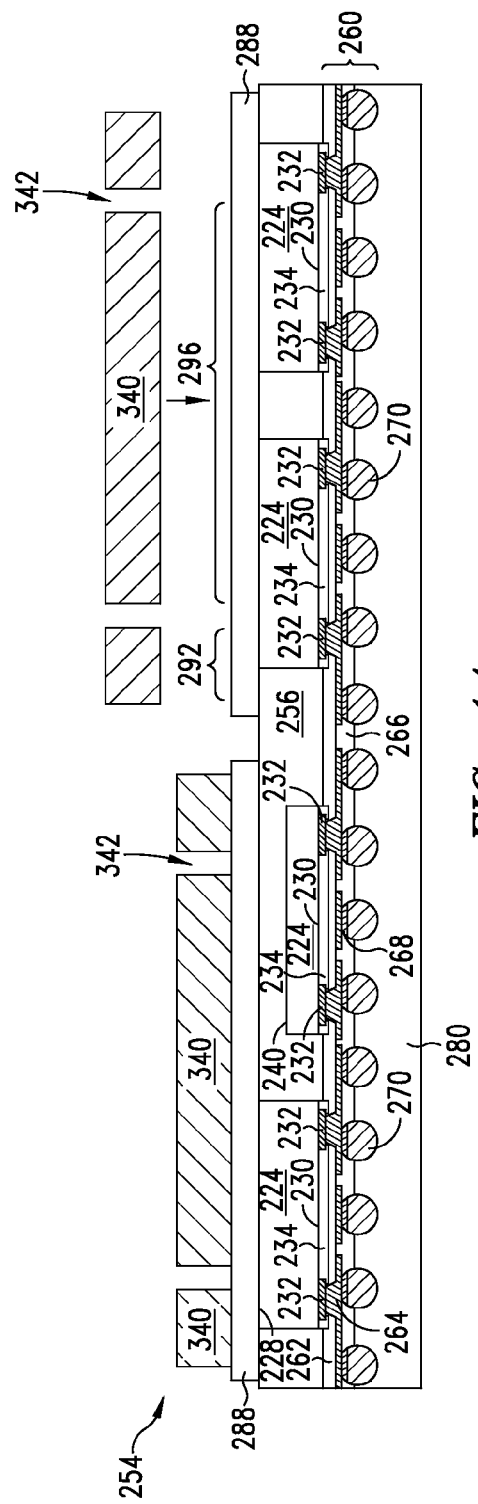
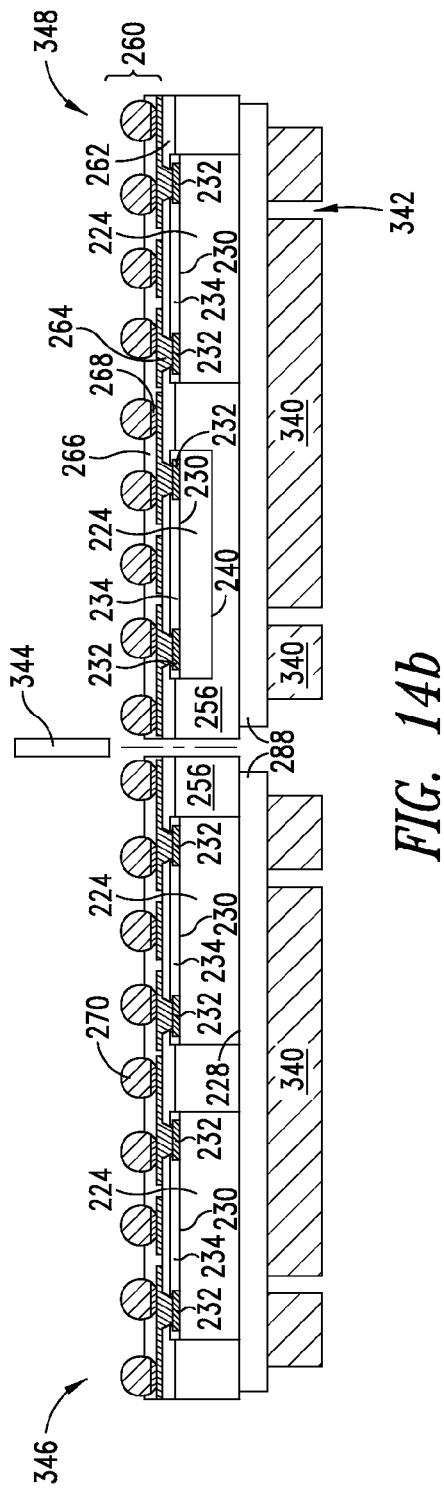
FIG. 14a
FIG. 14b

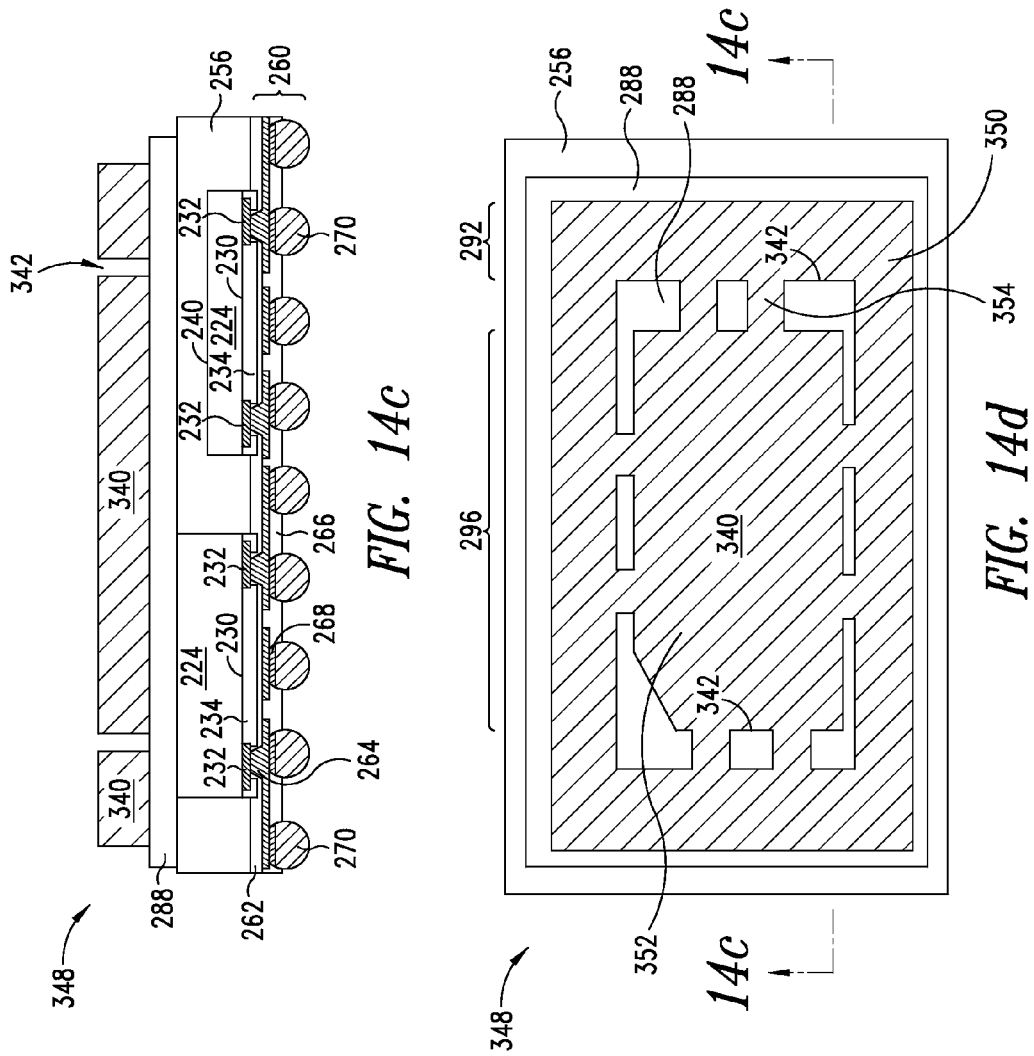

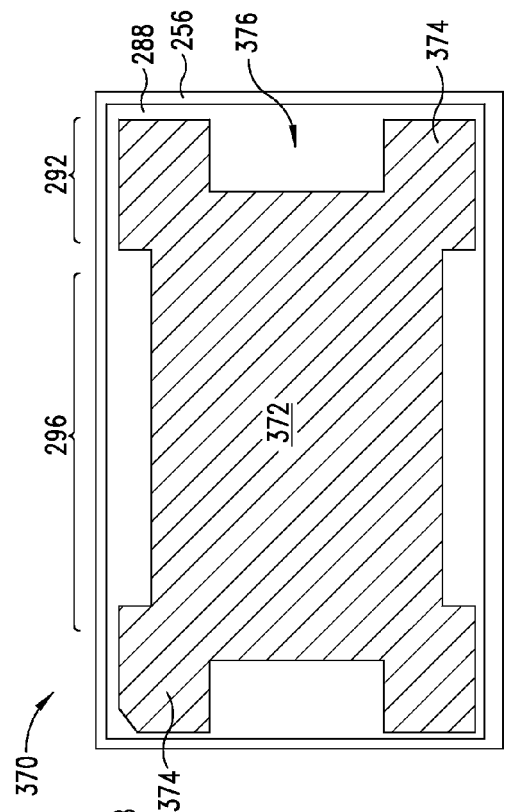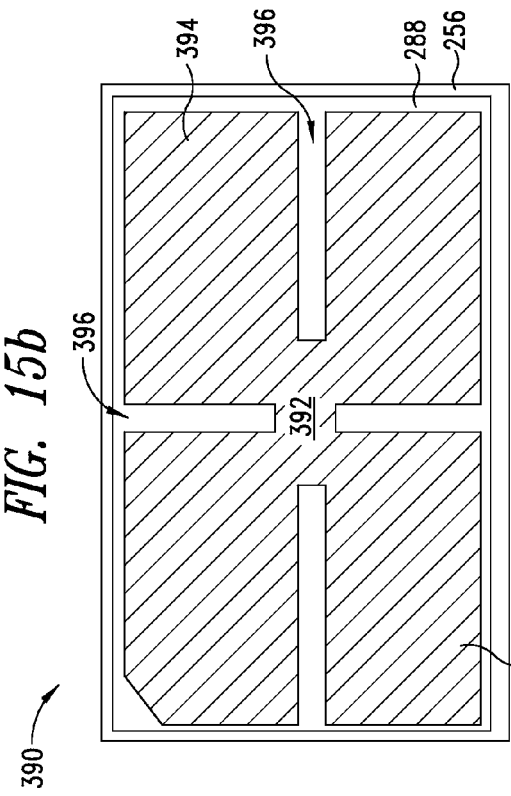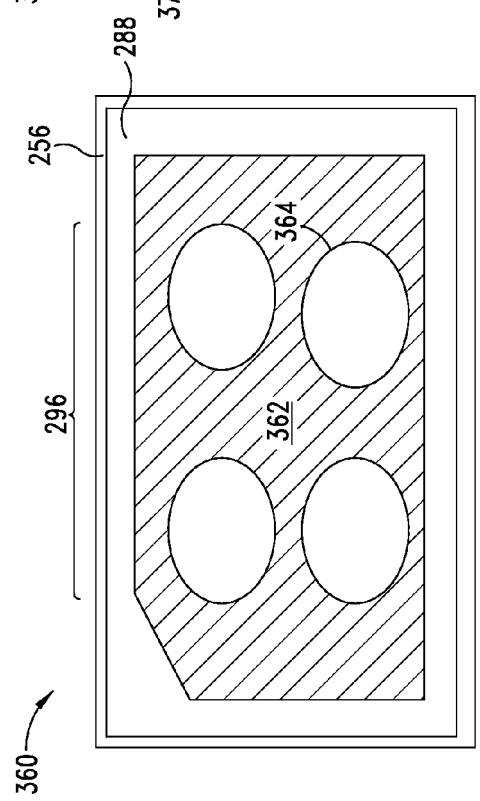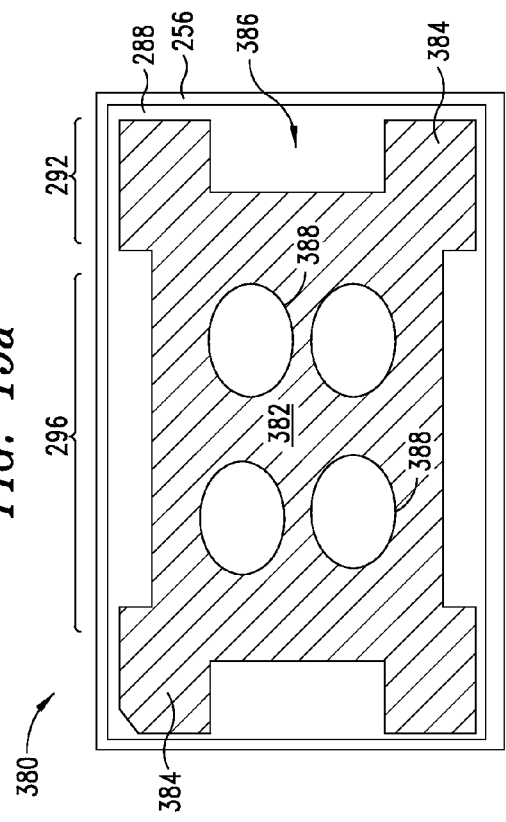

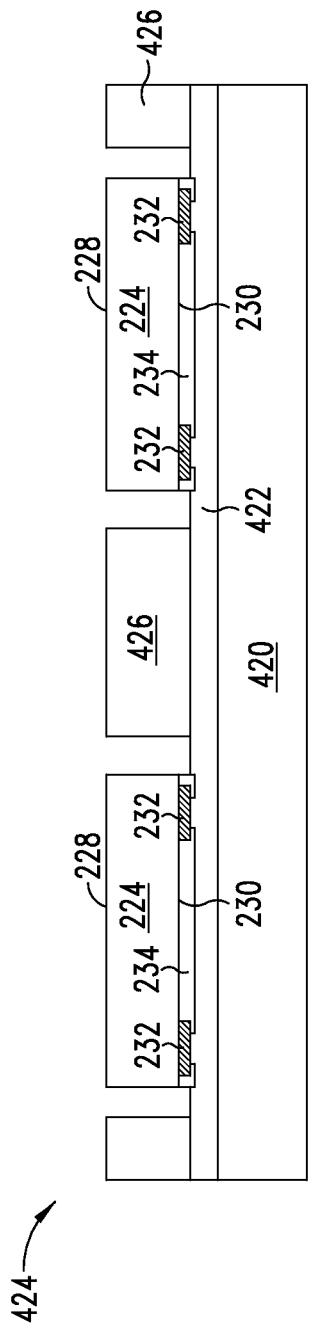
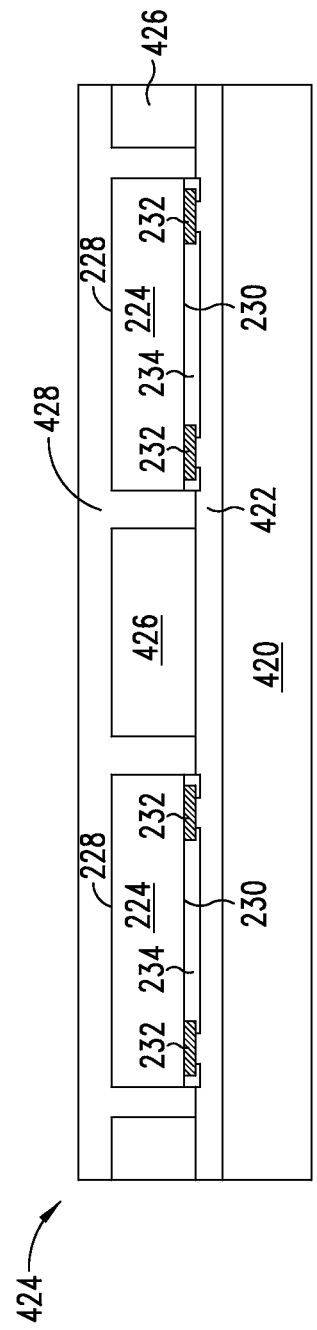

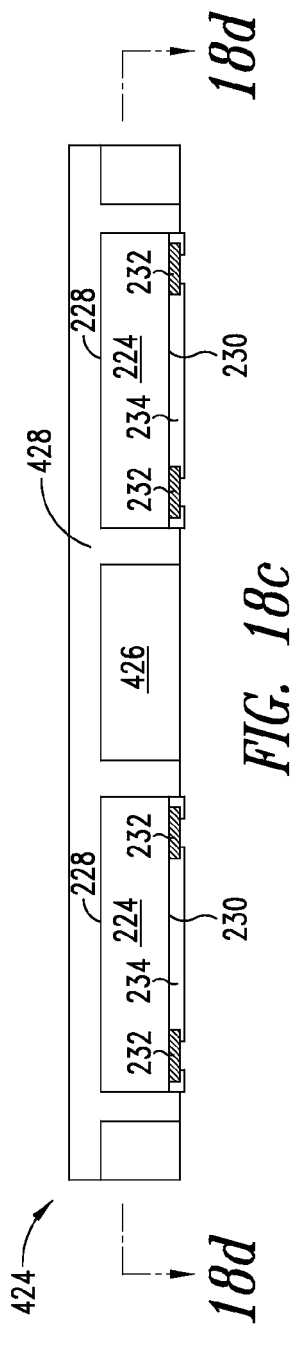
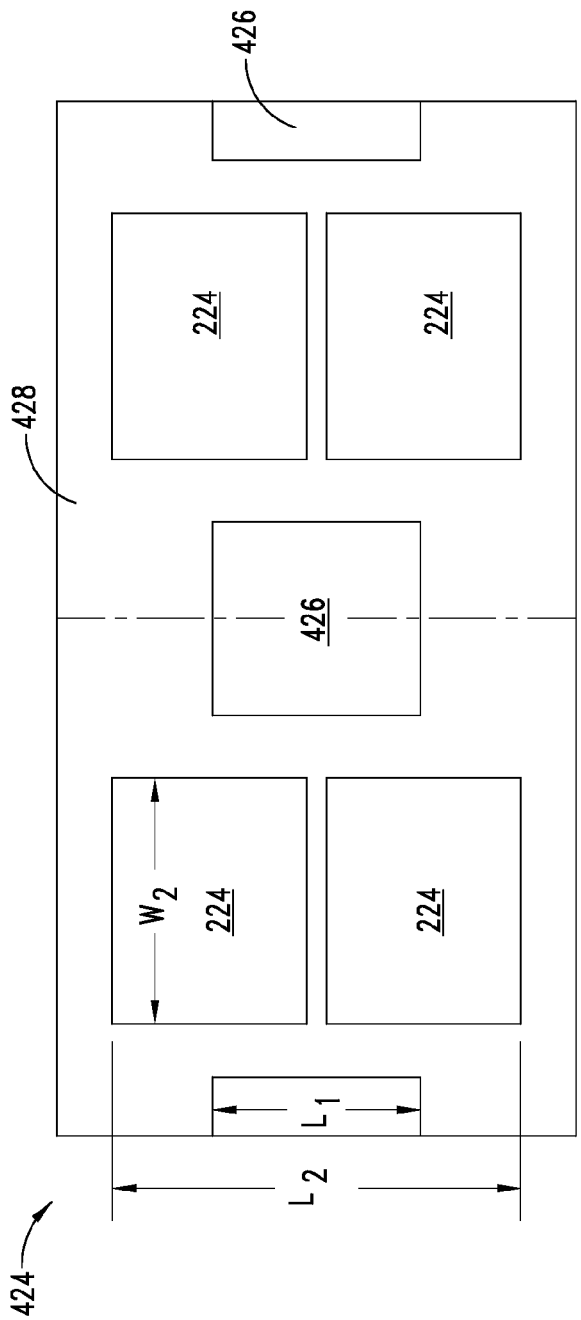

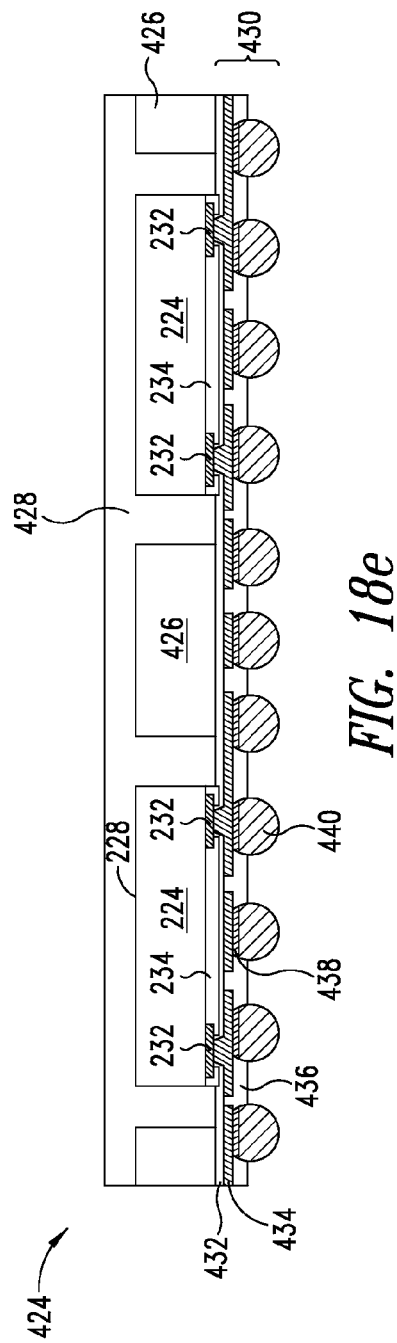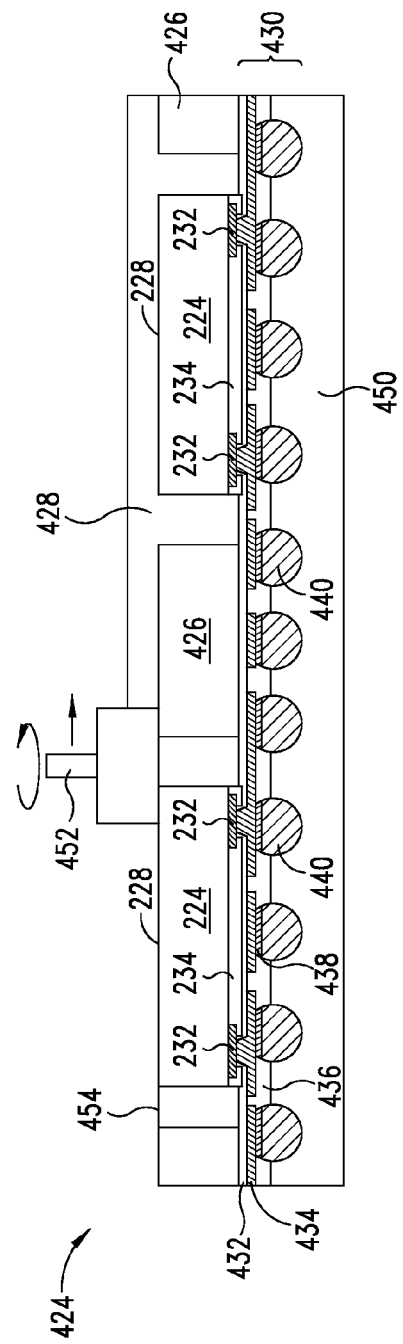

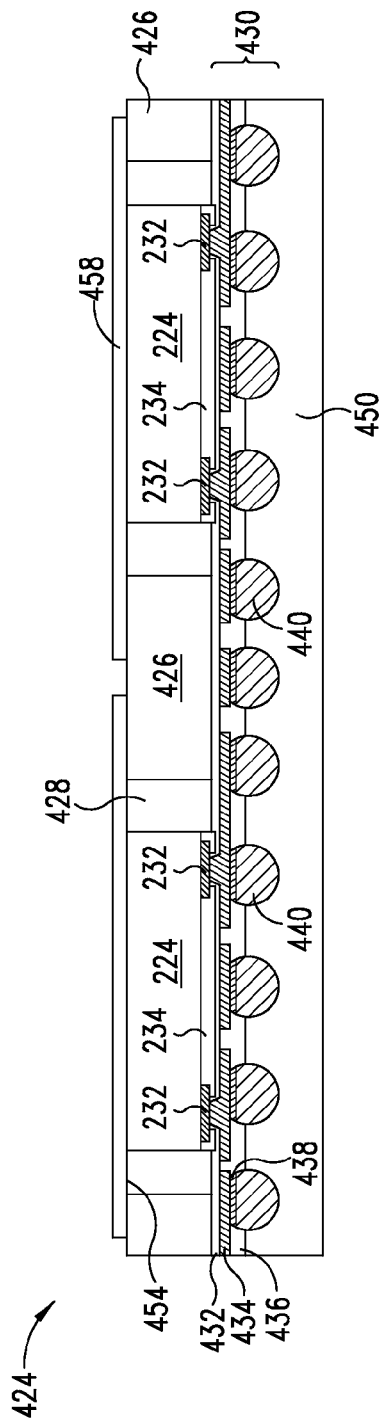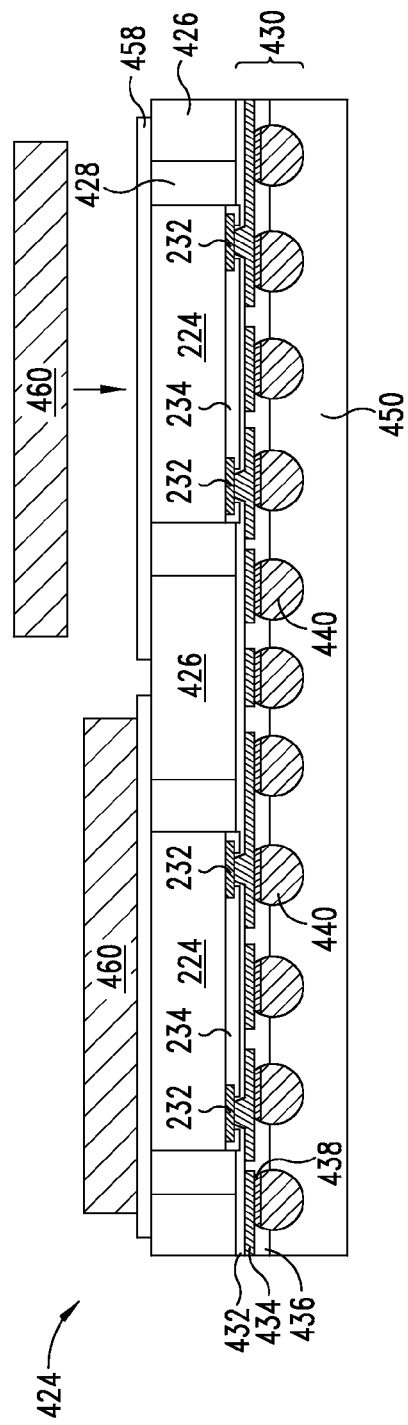

SEMICONDUCTOR DEVICE AND METHOD OF FORMING THERMAL LID FOR BALANCING WARPAGE AND THERMAL MANAGEMENT

CLAIM OF DOMESTIC PRIORITY

The present application is a continuation-in-part of U.S. patent application Ser. No. 13/231,789, now U.S. Pat. No. 8,912,648, filed Sep. 13, 2011, which is a division of U.S. patent application Ser. No. 12/625,975, now U.S. Pat. No. 8,034,661, filed Nov. 25, 2009, which applications are incorporated herein by reference.

FIELD OF THE INVENTION

The present invention relates in general to semiconductor devices and, more particularly, to a semiconductor device and method of forming stiffeners and heat spreaders for semiconductor packages.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, and various signal processing circuits.

Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The structure of semiconductor material allows the material's electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed operations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support, electrical interconnect, and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

Wafer level chip scale package (WLCSP) and fan-out wafer level package (FO-WLP) often contain large array semiconductor die that redistribute signal paths from fine pitch bonding pads of the die to the periphery fan-out area for higher functional integration to external devices. The large array WLCSP are known to experience reliability problems, in particular with solder joint failures during temperature cycling and drop impact testing. In addition, the large array WLCSPs tend to have a warpage issue due to the large die size.

Another goal of semiconductor manufacturing is to produce higher performance semiconductor devices. An increase in device performance can be accomplished by forming active components that are capable of operating at higher speeds or frequencies. High-performance semiconductor devices generate significant heat that must be adequately dissipated. Without effective heat dissipation, the generated heat can reduce performance, decrease reliability, and reduce the useful lifetime of the semiconductor device. Conventional heat spreaders have too high of coefficients of thermal expansion (CTE), i.e., greater than 14 parts per million per degree Celsius (ppm/° C.). The semiconductor package is subject to warpage or bending due to differences in CTE of the semiconductor die and surrounding structures within the package, such as high CTE heat spreaders. Warpage of the semiconductor package can cause joint defects or failures and reduce reliability of the electrical connections across the device. Warpage of the semiconductor package also reduces manufacturing yield and package reliability, and leads to increased cost. Other heat spreaders have too low of thermal conductivity, i.e., less than 60 watts per meter kelvin (W/m·K), and lack adequate heat dissipation. Alternative materials used in heat spreaders, such as tungsten copper (WCu), molybdenum copper (MoCu), and MoCu alloys significantly increase the cost of manufacturing the semiconductor package.

SUMMARY OF THE INVENTION

A need exists for a cost effective heat dissipation structure while reducing warpage in FO-WLP and WLCSP. Accordingly, in one embodiment, the present invention is a method of making a semiconductor device comprising the steps of providing a semiconductor die, depositing an encapsulant over the semiconductor die, forming a stiffening layer over the semiconductor die and encapsulant, and forming a heat spreader over the semiconductor die.

In another embodiment, the present invention is a method of making a semiconductor device comprising the steps of providing a first semiconductor die, depositing an encapsulant over the first semiconductor die, forming a stiffening layer adjacent to the first semiconductor die, and forming a heat spreader over the first semiconductor die.

In another embodiment, the present invention is a semiconductor device comprising a first semiconductor die. An encapsulant is deposited over the first semiconductor die. A stiffening layer is disposed over the encapsulant. A heat spreader is disposed over the first semiconductor die.

In another embodiment, the present invention is a semiconductor device comprising a first semiconductor die. An encapsulant is deposited over the first semiconductor die. A heat spreader including an opening is formed over the first semiconductor die and encapsulant.

BRIEF DESCRIPTION OF THE DRAWINGS

FIGS. 11a-11e illustrate a semiconductor wafer with a plurality of semiconductor die separated by a saw street;

FIGS. 12a-12j illustrate a method of forming a FO-WLCSP with a combination cover for thermal and warpage management;

FIGS. 13a-13d illustrate FO-WLCSPs including alternative combination covers;

FIGS. 14a-14d illustrate an alternative method of forming a FO-WLCSP with a heat spreader;

FIGS. 15a-15d illustrate alternative heat spreaders formed over a FO-WLCSP;

FIGS. 18a-18j illustrate a method of forming a FO-WLCSP including a stiffener and heat spreader;

DETAILED DESCRIPTION OF THE DRAWINGS

Figure 1:
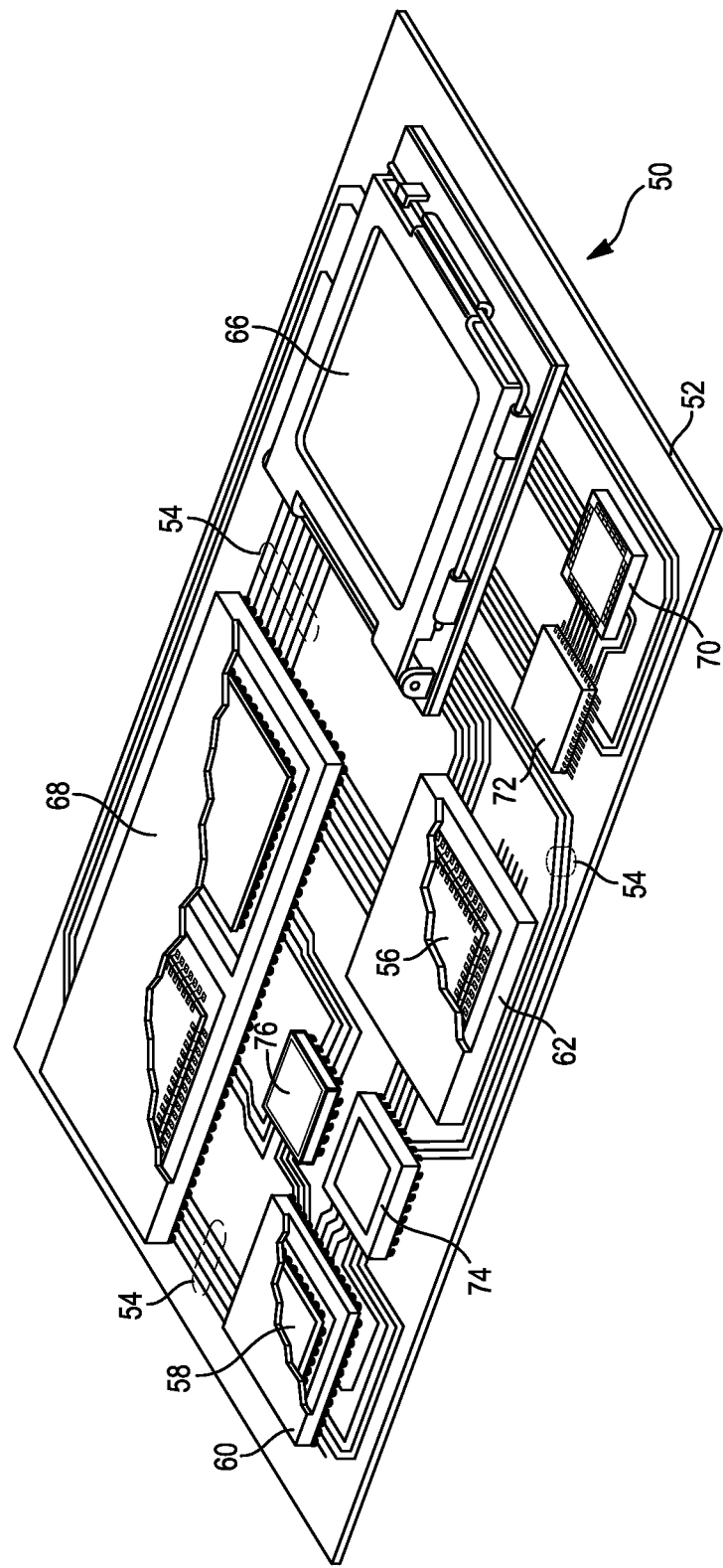
FIG. 1 illustrates a printed circuit board (PCB) with different types of packages mounted to a surface of the PCB.

The present invention is described in one or more embodiments in the following description with reference to the figures, in which like numerals represent the same or similar elements. While the invention is described in terms of the best mode for achieving objectives of the invention, those skilled in the art will appreciate that the disclosure is intended to cover alternatives, modifications, and equivalents as may be included within the spirit and scope of the invention as defined by the appended claims and claims equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices by dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

Back-end manufacturing refers to cutting or singulating the finished wafer into the individual semiconductor die and then packaging the die for structural support, electrical interconnect, and environmental isolation. To singulate the semiconductor die, the wafer is scored and broken along nonfunctional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or PCB 52 with a plurality of semiconductor packages mounted on a surface of PCB 52. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a tablet, cellular phone, digital camera, or other electronic device. Alternatively, electronic device 50 can be a graphics card, network interface card, or other signal processing card that can be inserted into a computer. The semiconductor package can include microprocessors, memories, application specific integrated circuits (ASIC), microelectromechanical systems (MEMS), logic circuits, analog circuits, radio frequency (RF) circuits, discrete devices, or other semiconductor die or electrical components. Miniaturization and weight reduction are essential for the products to be accepted by the market. The distance between semiconductor devices may be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, land grid array (LGA) 66, multi-chip module (MCM) 68, quad flat non-leaded package (QFN) 70, quad flat package 72, embedded wafer level ball grid array (eWLB) 74, and WLCSP 76 are shown mounted on PCB 52. In one embodiment, eWLB 74 is a FO-WLP, and WLCSP 76 is a fan-in wafer level package (FI-WLP). Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
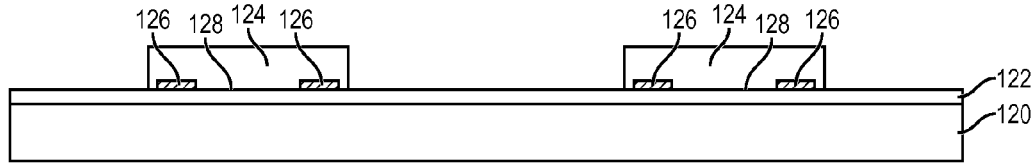
FIGS. 2a-2f illustrate a process of forming a compliant stress relief buffer around a semiconductor die.

FIGS. 2a-2f illustrate, in relation to FIG. 1, a process of forming compliant stress relief buffer around a semiconductor die. In FIG. 2a, a substrate or carrier 120 contains temporary or sacrificial base material such as silicon, polymer, polymer composite, metal, ceramic, glass, glass epoxy, beryllium oxide, or other suitable low-cost, rigid material or bulk semiconductor material for structural support. An optional interface layer 122 can be formed over carrier 120 as a temporary adhesive bonding film or etch-stop layer.

Semiconductor die or components 124 are mounted to interface layer 122 with contact pads 126 on active surface 128 oriented downward toward carrier 120. Active surface 128 contains analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 128 to implement analog circuits or digital circuits, such as digital signal processor (DSP), ASIC, MEMS, memory, or other signal processing circuit. Semiconductor die 124 may also contain IPDs, such as inductors, capacitors, and resistors, for RF signal processing.

Figure 2B:
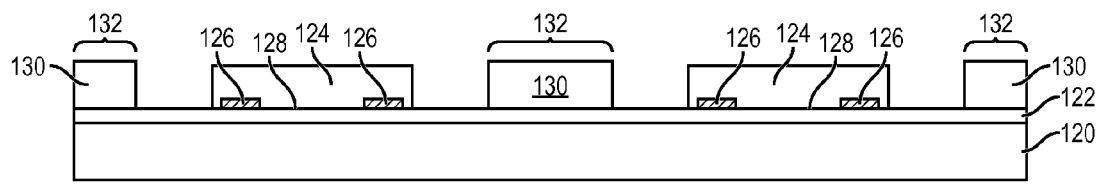

In FIG. 2b, a compliant stress relief buffer or block structure 130 is pre-formed as circular or square patches, or rectangular strips using a molding process. Stress relief buffer 130 contains compliant material, such as polymer, epoxy, polymeric material, epoxy resin with filler, or epoxy acrylate with filler. Alternatively, stress relief buffer 130 can be polytetrafluoroethylene pre-impregnated (prepreg) with a combination of phenolic cotton paper, epoxy, resin, woven glass, matte glass, polyester, and other reinforcement fibers or fabrics, PCB board material with core layer, or other damping material. Stress relief buffer 130 is mounted to interface layer 122 in locations 132 designated for bump formation, i.e., at the edges or corners of the completed FO-WLCSP.

Figure 2C:
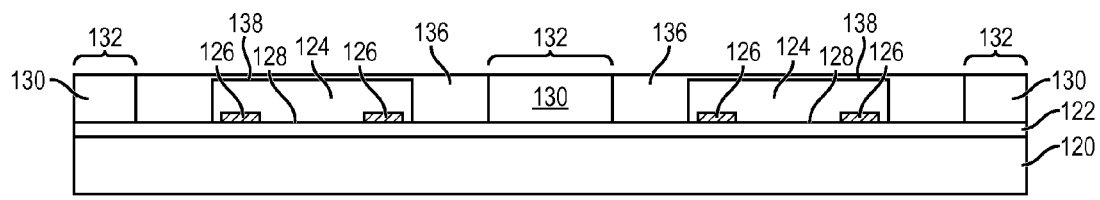

In FIG. 2c, an encapsulant or molding compound 136 is deposited between stress relief buffer 130 and semiconductor die 124 and over the semiconductor die to a level even with the stress relief buffer using a paste printing, compressive molding, transfer molding, liquid encapsulant molding, vacuum lamination, spin coating, or other suitable applicator. Stress relief buffer 130 can be thicker than semiconductor die 124 so encapsulant 136 covers back surface 138 of the die. Encapsulant 136 can be polymer composite material, such as epoxy resin with filler, epoxy acrylate with filler, or polymer with proper filler. Encapsulant 136 is non-conductive and environmentally protects the semiconductor device from external elements and contaminants.

Figure 2D:
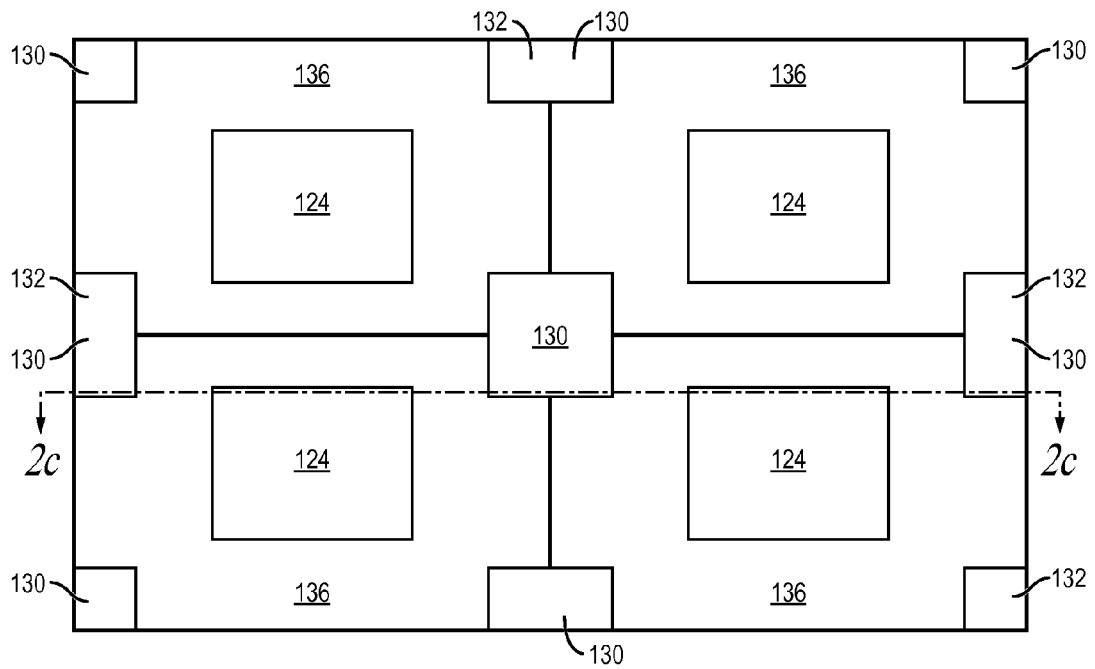

FIG. 2d shows a top view of a grouping of four semiconductor die 124, stress relief buffer 130, and encapsulant 136 over carrier 120. Stress relief buffer 130 is mounted to locations 132 designated for bump formation at the edges and corners of the FO-WLCSP.

Figure 2E:
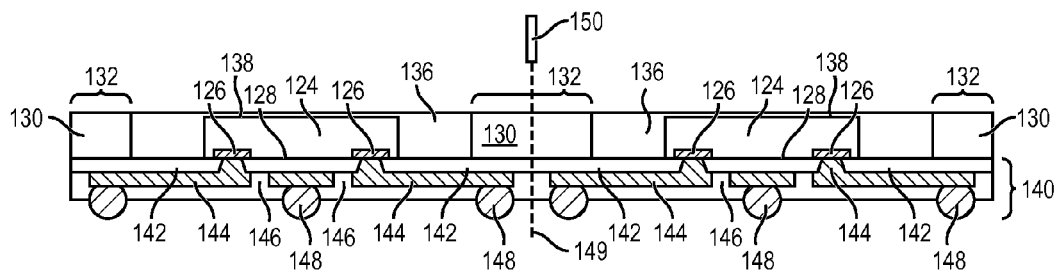

In FIG. 2e, temporary carrier 120 and optional interface layer 122 are removed by chemical etching, mechanical peel-off, chemical mechanical planarization (CMP), mechanical grinding, thermal bake, laser scanning, or wet stripping. A bottom-side build-up interconnect structure 140 is formed over semiconductor die 124, stress relief buffer 130, and encapsulant 136. The build-up interconnect structure 140 includes an insulating or passivation layer 142 containing one or more layers of silicon dioxide ($SiO_2$), silicon nitride (Si3N4), silicon oxynitride (SiON), tantalum pentoxide (Ta2O5), aluminum oxide (Al2O3), low temperature (≤250° C.) cured polymer photoresist, such as benzocyclobutene (BCB), polybenzoxazoles (PBO), epoxy based photosensitive polymer dielectric, or other material having similar insulating and structural properties. Insulating layer 142 is formed using PVD, CVD, printing, spin coating, spray coating, sintering or thermal oxidation. A portion of insulating layer 142 is removed by an etching process to expose contact pads 126 of semiconductor die 124.

An electrically conductive layer 144 is formed over insulating layer 142 and contact pads 126 using a patterning and metal deposition process such as PVD, CVD, sputtering, electrolytic plating, and electroless plating. Conductive layer 144 can be one or more layers of aluminum (Al), copper (Cu), titanium (Ti), titanium tungsten (TiW), tin (Sn), nickel (Ni), gold (Au), silver (Ag), tungsten (W), or other suitable electrically conductive material. Conductive layer 144 operates as a redistribution layer (RDL). One portion of conductive layer 144 is electrically connected to contact pads 126 of semiconductor die 124. Other portions of conductive layer 144 can be electrically common or electrically isolated depending on the design and function of the semiconductor device.

An insulating or passivation layer 146 is formed over insulating layer 142 and conductive layer 144 using PVD, CVD, printing, spin coating, spray coating, sintering or thermal oxidation. Insulating layer 146 can be one or more layers of SiO2, Si3N4, SiON, Ta2O5, Al2O3, low temperature (250° C.) cured polymer photoresist, such as BCB, PBO, or epoxy based photosensitive polymer dielectric, or other material having similar insulating and structural properties. A portion of insulating layer 146 is removed by an etching process to expose conductive layer 144.

An electrically conductive bump material is deposited over build-up interconnect structure 140 and electrically connected to conductive layer 144 using an evaporation, electrolytic plating, electroless plating, ball drop, or screen printing process. The bump material can be Al, Sn, Ni, Au, Ag, lead (Pb), bismuth (Bi), Cu, solder, and combinations thereof, with an optional flux solution. For example, the bump material can be eutectic Sn/Pb, high-lead solder, or lead-free solder. The bump material is bonded to conductive layer 144 using a suitable attachment or bonding process. In one embodiment, the bump material is reflowed by heating the material above its melting point to form spherical balls or bumps 148. In some applications, bumps 148 are reflowed a second time to improve electrical contact to conductive layer 144. The bumps can also be compression bonded to conductive layer 144. Bumps 148 represent one type of interconnect structure that can be formed over conductive layer 144. The interconnect structure can also use bond wires, stud bump, micro bump, or other electrical interconnect.

Figure 2F:
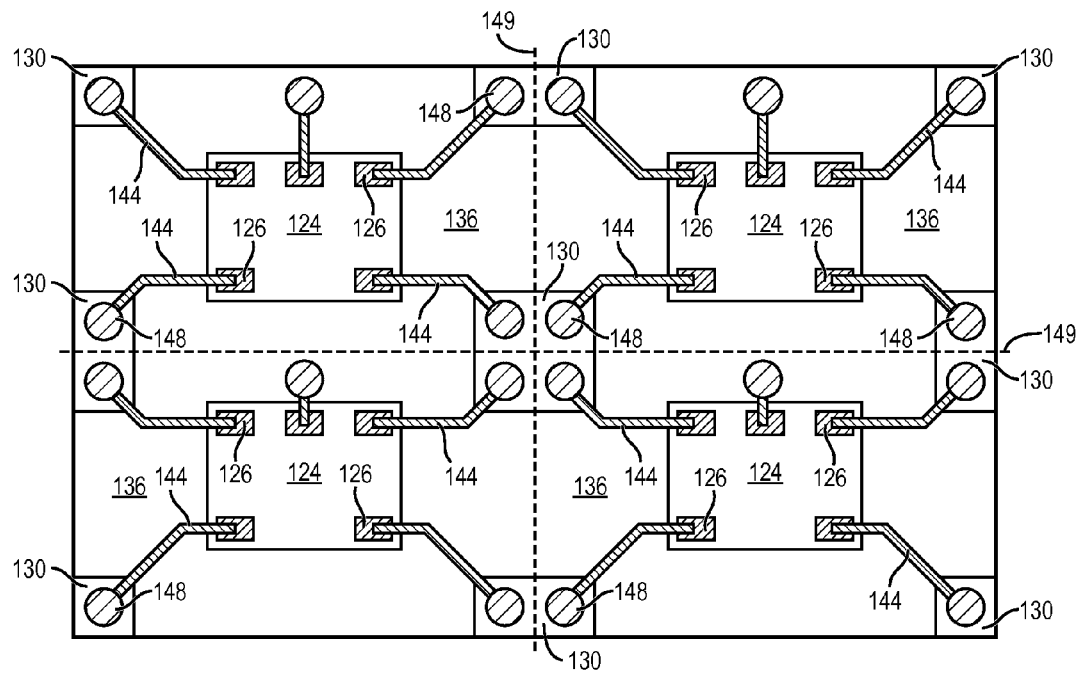

FIG. 2f shows a top view of a grouping of four semiconductor die 124, stress relief buffer 130, and encapsulant 136 with contact pads 126 electrically connected to bumps 148 through conductive layer 144. The final semiconductor package, including semiconductor die 124, encapsulant compound 136, stress relief buffer 130, and interconnect structure 140, is singulated along lines 149 with saw blade or laser cutting device 150 in FIGS. 2e and 2f into individual semiconductor devices.

Figure 3:
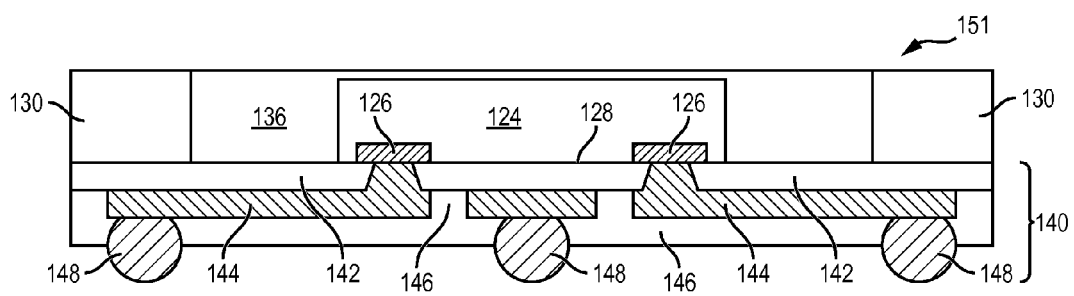
FIG. 3 illustrates a FO-WLCSP with the stress relief buffer around the semiconductor die.

FIG. 3 shows FO-WLCSP 151 after singulation. Semiconductor die 124 is electrically connected to bottom-side build-up interconnect structure 140 and bumps 148. The pre-formed compliant stress relief buffer 130 is disposed around edges, corners, and other package integrity critical regions of FO-WLCSP 151 to prevent failure of bumps 148 during temperature cycling testing and other mechanical shock or impact of a reliability or drop test by absorbing thermo-mechanical stress. Stress relief buffer 130 has a low Young's modulus, i.e., less than a Young's modulus of encapsulant 136, good elasticity and resiliency characteristics, and CTE similar to or slightly less than the encapsulant. Stress relief buffer 130 also serves to reduce die shifting during the encapsulation process.

Figure 4A:
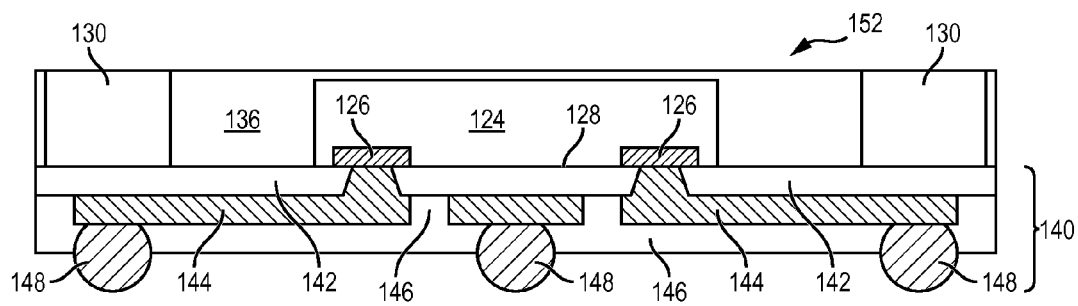
FIGS. 4a-4b illustrate the stress relief buffer extending partially or completely along a side of the FO-WLCSP.
Figure 4B:
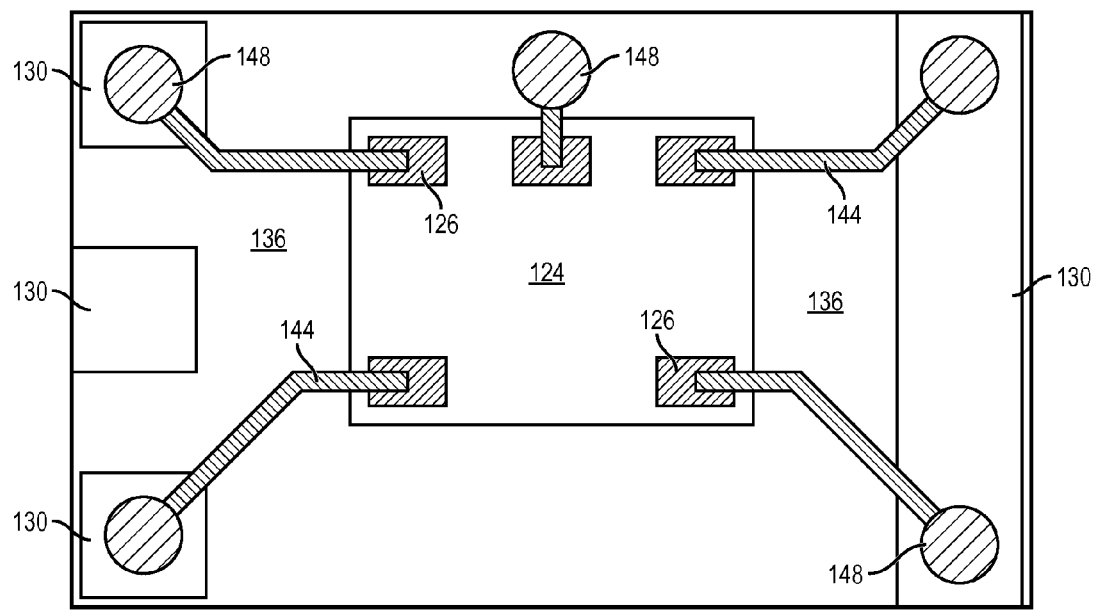

FIGS. 4a and 4b show a cross-sectional and top view of pre-formed compliant stress relief buffer 130 extending partially or completely along a side of FO-WLCSP 152.

Figure 5:
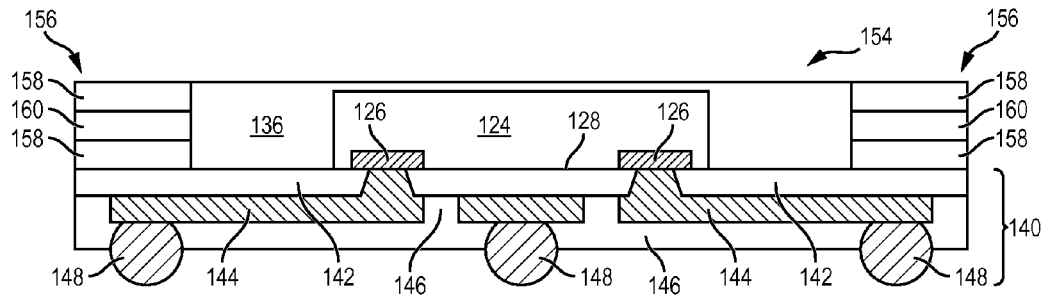
FIG. 5 illustrates a multi-layer composite stress relief buffer.

FIG. 5 shows an embodiment of FO-WLCSP 154, similar to the structure described in FIGS. 2a-2f, with pre-formed composite stress relief buffer 156 containing multiple layers. In one embodiment, composite stress relief buffer 156 has a compliant material layer 158, silicon layer 160, and compliant material layer 158. Alternatively, the layers of composite stress relief buffer 156 are metal/compliant material/metal, or silicon/compliant material/silicon. Composite stress relief buffer 156 reduces warpage in FO-WLCSP 154. By reducing warpage and CTE-induced stress, FO-WLCSP 154 has reduced solder joint failure, particularly around the periphery of the semiconductor die.

Figure 6:
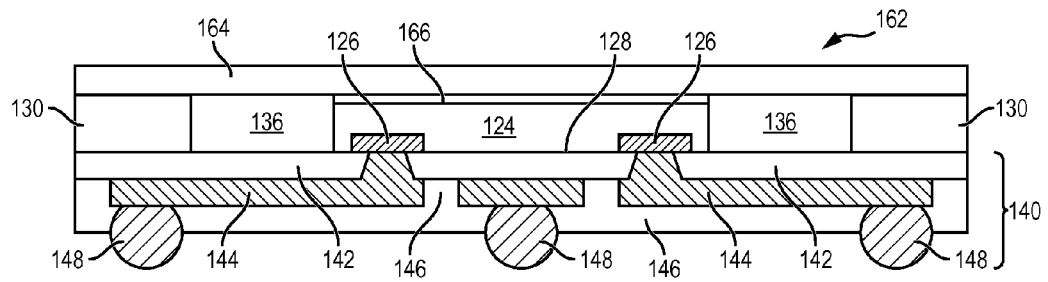
FIG. 6 illustrates a stiffener mounted over the stress relief buffer and semiconductor die.

FIG. 6 shows an embodiment of FO-WLCSP 162, similar to the structure described in FIGS. 2a-2f, with metal stiffener or layer 164 mounted over stress relief buffer 130 and encapsulant 136. An adhesive layer is deposited over stress relief buffer 130 to secure stiffener 164. Stiffener 164 reduces warpage in FO-WLCSP 162. Stiffener 164 can be used as a heat sink with an optional thermal interface material (TIM) 166 for heat dissipation from semiconductor die 124. As a heat sink, stiffener 164 can be Al, Cu, or another material with high thermal conductivity. TIM 166 aids in the distribution and dissipation of heat generated by semiconductor die 124. Stiffener 164 can also operate as an electromagnetic interference (EMI) or radio frequency interference (RFI) shielding layer. As an EMI or RFI shielding layer, stiffener 164 can be Cu, Al, ferrite or carbonyl iron, stainless steel, nickel silver, low-carbon steel, silicon-iron steel, foil, epoxy, conductive resin, and other metals and composites capable of blocking or absorbing EMI, RFI, and other inter-device interference. The shielding layer can also be a non-metal material such as carbon-black or aluminum flake to reduce the effects of EMI and RFI. Stiffener 164 can be grounded to divert the EMI and RFI signals.

Figure 7:
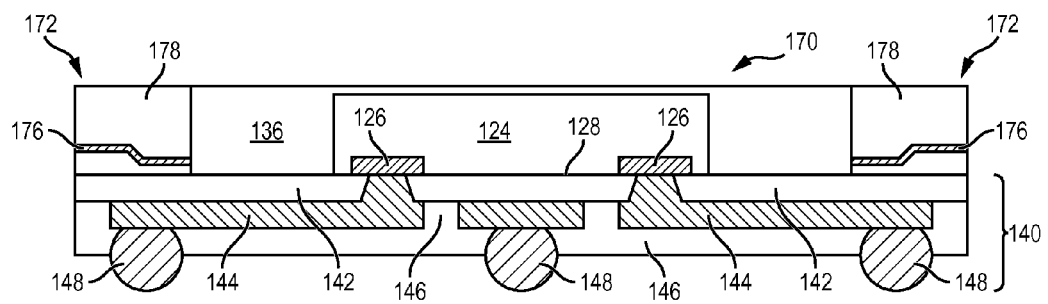
FIG. 7 illustrates a circuit layer formed in the stress relief buffer.

FIG. 7 shows an embodiment of FO-WLCSP 170, similar to the structure described in FIGS. 2a-2f, with pre-formed stress relief buffer 172 containing circuit layers 176 embedded within compliant stress relief material 178. Circuit layers 176 may contain analog or digital circuits implemented as active devices, passive devices, conductive layers, and dielectric layers formed within stress relief material 178.

Figure 8A:
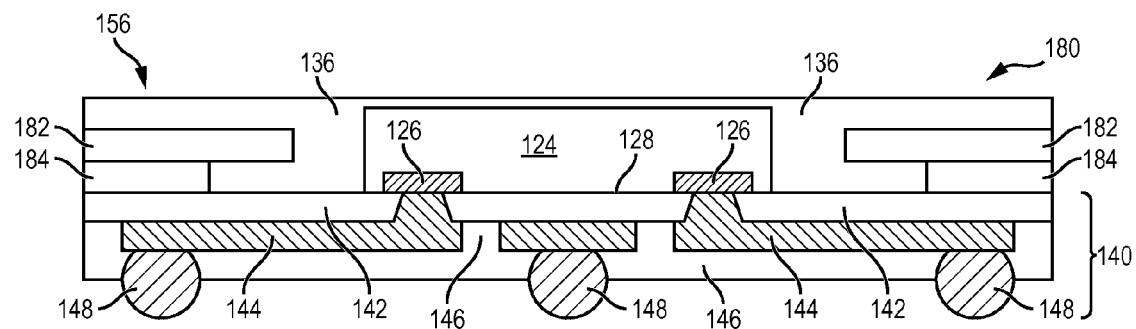
FIGS. 8a-8b illustrate a stiffener formed over a stress relief buffer that is thinner than the semiconductor die.
Figure 8B:
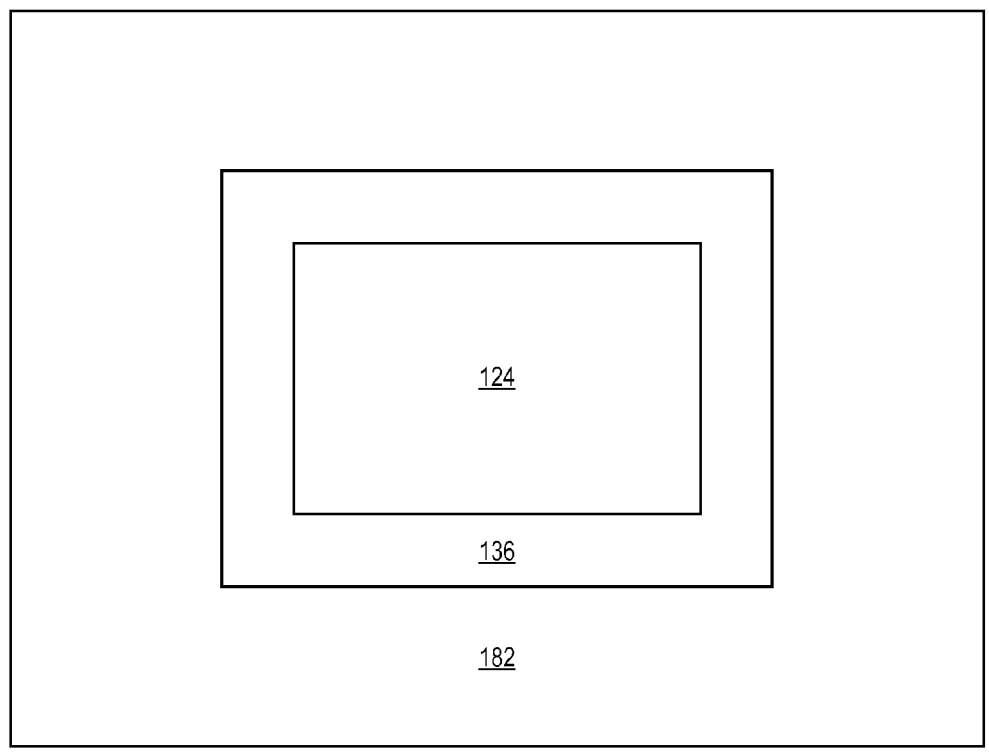

FIG. 8a shows an embodiment of FO-WLCSP 180, similar to the structure described in FIGS. 2a-2f, with stress relief buffer 184 made thinner than semiconductor die 124. A metal stiffener or layer 182 is mounted over stress relief buffer 130 prior to depositing encapsulant 136. An adhesive layer is deposited over stress relief buffer 184 to secure stiffener 182. Stiffener 182 can be formed as a window completely around semiconductor die 124, as shown in FIG. 8b. Stiffener 182 reduces warpage in FO-WLCSP 180.

Figure 9A:
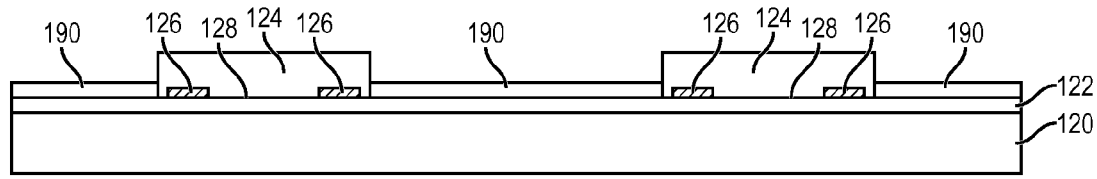
FIGS. 9a-9c illustrate a process of forming a compliant stress relief layer around a semiconductor die.
Figure 9B:
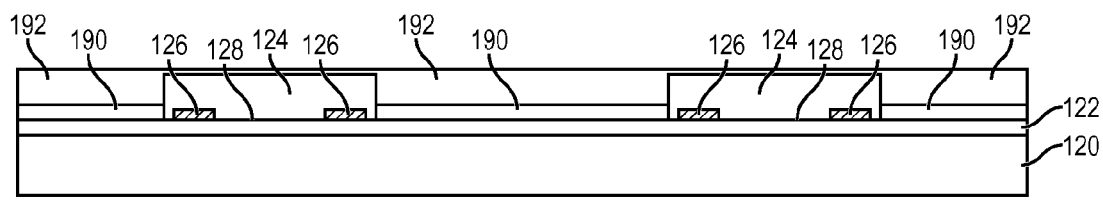
Figure 9C:
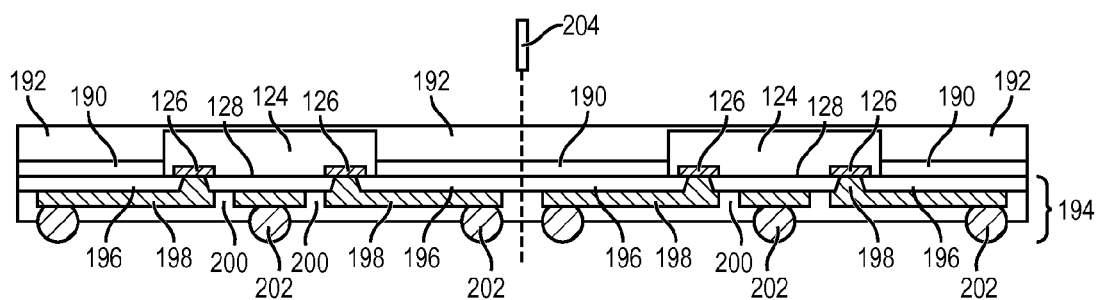

FIGS. 9a-9c illustrate, in relation to FIG. 1, a process of forming a compliant stress relief layer around semiconductor die. Continuing with the structure described in FIG. 2a, a compliant stress relief layer 190 is formed over interface layer 122 around semiconductor die 124 using spray coating or screen printing. Stress relief layer 190 can be deposited prior to mounting semiconductor die 124. There may be a gap or there may be no gap between stress relief layer 190 and semiconductor die 124. In the case of a gap, an underfill material, such as epoxy or polymeric material, is applied over die edge to cover the gap to prevent die shifting during encapsulation. Stress relief layer 190 can be a compliant material, such as polymer, epoxy, polymeric material, epoxy resin with filler, epoxy acrylate with filler, photo-sensitive resist, or other compliant material having high elongation, low modulus, and balanced CTE. In one embodiment, stress relief layer 190 is an insulating material, such as polyimide, PBO, silicon base elastomer, or other similar material, with a low CTE (20 ppm/° C. or less) and a low Young's modulus of 200 megapascal (MPa) or less. Stress relief layer 190 is typically 15-100 micrometers (μm) in thickness.

In FIG. 9b, an encapsulant or molding compound 192 is deposited over stress relief layer 190 and semiconductor die 124 using a paste printing, compressive molding, transfer molding, liquid encapsulant molding, vacuum lamination, spin coating, or other suitable applicator. Encapsulant 192 can be polymer composite material, such as epoxy resin with filler, epoxy acrylate with filler, or polymer with proper filler. Encapsulant 192 is non-conductive and environmentally protects the semiconductor device from external elements and contaminants.

In FIG. 9c, temporary carrier 120 and optional interface layer 122 are removed by chemical etching, mechanical peel-off, CMP, mechanical grinding, thermal bake, laser scanning, or wet stripping. A bottom-side build-up interconnect structure 194 is formed over semiconductor die 124 and stress relief layer 190. The build-up interconnect structure 194 includes an insulating or passivation layer 196 containing one or more layers of SiO2, Si3N4, SiON, Ta2O5, Al2O3, low temperature (≤250° C.) cured polymer photoresist, such as BCB, PBO, or epoxy based photosensitive polymer dielectric, or other material having similar insulating and structural properties. Insulating layer 196 is formed using PVD, CVD, printing, spin coating, spray coating, sintering or thermal oxidation. A portion of insulating layer 196 is removed by an etching process to expose contact pads 126 of semiconductor die 124.

An electrically conductive layer 198 is formed over insulating layer 196 and contact pads 126 using a patterning and metal deposition process such as PVD, CVD, sputtering, electrolytic plating, and electroless plating. Conductive layer 198 can be one or more layers of Al, Cu, Sn, Ni, Au, Ag, or other suitable electrically conductive material. Conductive layer 198 operates as an RDL. One portion of conductive layer 198 is electrically connected to contact pads 126 of semiconductor die 124. Other portions of conductive layer 198 can be electrically common or electrically isolated depending on the design and function of the semiconductor device.

An insulating or passivation layer 200 is formed over insulating layer 196 and conductive layer 198 using PVD, CVD, printing, spin coating, spray coating, sintering or thermal oxidation. Insulating layer 200 can be one or more layers of SiO2, Si3N4, SiON, Ta2O5, Al2O3, low temperature (250° C.) cured polymer photoresist, such as BCB, PBO, or epoxy based photosensitive polymer dielectric, or other material having similar insulating and structural properties. A portion of insulating layer 200 is removed by an etching process to expose conductive layer 198.

An electrically conductive bump material is deposited over build-up interconnect structure 194 and electrically connected to conductive layer 198 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 198 using a suitable attachment or bonding process. In one embodiment, the bump material is reflowed by heating the material above its melting point to form spherical balls or bumps 202. In some applications, bumps 202 are reflowed a second time to improve electrical contact to conductive layer 198. The bumps can also be compression bonded to conductive layer 198. Bumps 202 represent one type of interconnect structure that can be formed over conductive layer 198. The interconnect structure can also use bond wires, stud bump, micro bump, or other electrical interconnect.

Figure 10A:
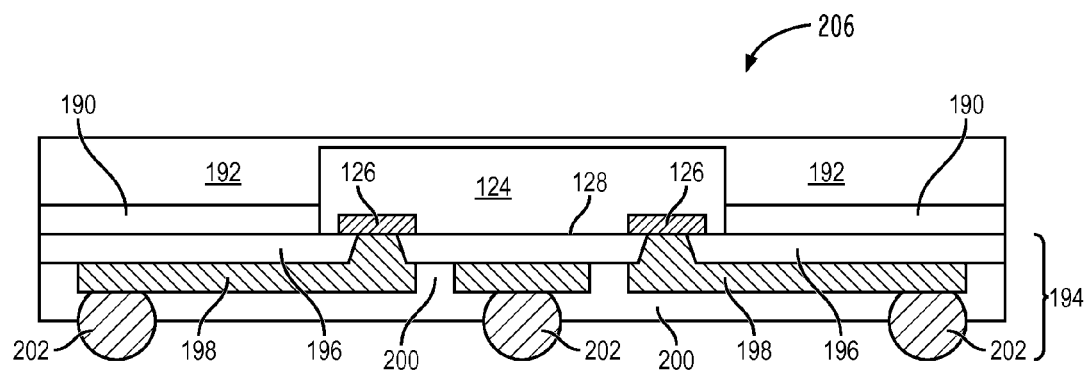
FIGS. 10a-10b illustrate the FO-WLCSP with the stress relief layer around the semiconductor die.
Figure 10B:
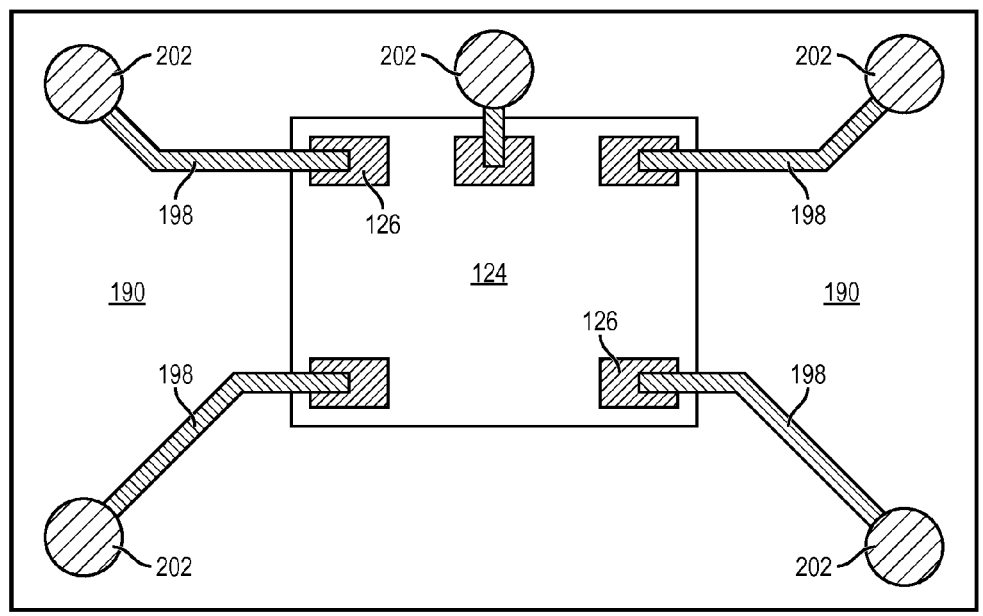

Semiconductor die 124 are singulated with saw blade or laser cutting device 204 into individual semiconductor devices. FIG. 10a shows a cross-sectional view of FO-WLCSP 206 after singulation. FIG. 10b shows a bottom view of semiconductor die 124 and stress relief layer 190 with contact pads 126 electrically connected to bumps 202 through conductive layer 198. The compliant stress relief layer 190 is disposed around semiconductor die 124 to prevent failure of bumps 202 during temperature cycling testing and other mechanical shock or impact of a reliability or drop test by absorbing thermo-mechanical stress. Stress relief layer 190 has a low Young's modulus, i.e., less than a Young's modulus of encapsulant 192, good elasticity and resiliency characteristics, and CTE similar to or slightly less than the encapsulant. Stress relief layer 190 also serves to reduce die shifting during the encapsulation process.

FIG. 11a shows a semiconductor wafer 220 with a base substrate material 222, such as silicon, germanium, aluminum phosphide, aluminum arsenide, gallium arsenide, gallium nitride, indium phosphide, silicon carbide, or other bulk semiconductor material for structural support. A plurality of semiconductor die or components 224 is formed on wafer 220 separated by a non-active, inter-die wafer area or saw street 226 as described above. Saw street 226 provides cutting areas to singulate semiconductor wafer 220 into individual semiconductor die 224. In one embodiment, semiconductor wafer 220 has a width or diameter of 100-450 millimeters (mm).

FIG. 11b shows a cross-sectional view of a portion of semiconductor wafer 220. Each semiconductor die 224 has a back or non-active surface 228 and an active surface 230 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 230 to implement analog circuits or digital circuits, such as DSP, ASIC, MEMS, memory, or other signal processing circuit. In one embodiment, semiconductor die 224 contains a MEMS, such as an accelerometer, strain gauge, microphone, or other sensor responsive to various external stimuli. Semiconductor die 224 may also contain integrated passive devices (IPDs), such as inductors, capacitors, and resistors, for RF signal processing.

An electrically conductive layer 232 is formed over active surface 230 using PVD, CVD, electrolytic plating, electroless plating process, or other suitable metal deposition process. Conductive layer 232 can be one or more layers of Al, Cu, Sn, Ni, Au, Ag, or other suitable electrically conductive material. Conductive layer 232 operates as contact pads electrically connected to the circuits on active surface 230. Conductive layer 232 can be formed as contact pads disposed side-byside a first distance from the edge of semiconductor die 224, as shown in FIG. 11b. Alternatively, conductive layer 232 can be formed as contact pads that are offset in multiple rows such that a first row of contact pads is disposed a first distance from the edge of the die, and a second row of contact pads alternating with the first row is disposed a second distance from the edge of the die.

An insulating or passivation layer 234 is formed over active surface 230 and conductive layer 232 using PVD, CVD, printing, spin coating, spray coating, sintering or thermal oxidation. Insulating layer 234 contains one or more layers of SiO2, Si3N4, SiON, Ta2O5, Al2O3, low temperature (≤250° C.) curable polymer, or other material having similar structural and insulating properties. A portion of insulating layer 234 is removed by an exposure or development process, laser direct ablation (LDA) using laser 236, etching, or other suitable method to expose conductive layer 232.

In FIG. 11c, back surface 228 of semiconductor wafer 220 undergoes an optional backgrinding operation with grinder 238 or other suitable mechanical or etching process to remove a portion of base material 222 and reduce the thickness of semiconductor wafer 220 including semiconductor die 224. The removal of base material 222 leaves new back surface 240 of semiconductor wafer 220.

In FIG. 11d, continuing from FIG. 11b or 11c, semiconductor wafer 220 undergoes electrical testing and inspection as part of a quality control process. Manual visual inspection and automated optical systems are used to perform inspections on semiconductor wafer 220. Software can be used in the automated optical analysis of semiconductor wafer 220. Visual inspection methods may employ equipment such as a scanning electron microscope, high-intensity or ultra-violet light, or metallurgical microscope. Semiconductor wafer 220 is inspected for structural characteristics including warpage, thickness variation, surface particulates, irregularities, cracks, delamination, and discoloration.

The active and passive components within semiconductor die 224 undergo testing at the wafer level for electrical performance and circuit function. Each semiconductor die 224 is tested for functionality and electrical parameters, as shown in FIG. 11d, using a test probe head 242 including a plurality of probes or test leads 244, or other testing device. Probes 244 are used to make electrical contact with nodes or conductive layer 232 on each semiconductor die 224 and provide electrical stimuli to contact pads 232. Semiconductor die 224 responds to the electrical stimuli, which is measured by computer test system 246 and compared to an expected response to test functionality of the semiconductor die. The electrical tests may include circuit functionality, lead integrity, resistivity, continuity, reliability, junction depth, electro-static discharge (ESD), RF performance, drive current, threshold current, leakage current, and operational parameters specific to the component type. The inspection and electrical testing of semiconductor wafer 220 enables semiconductor die 224 that pass to be designated as known good die (KGD) for use in a semiconductor package.

In FIG. 11e, semiconductor wafer 220 is singulated through saw street 226 using a saw blade or laser cutting tool 248 into individual semiconductor die 224. The individual semiconductor die 224 can be inspected and electrically tested for identification of KGD post singulation.

Figure 12A:
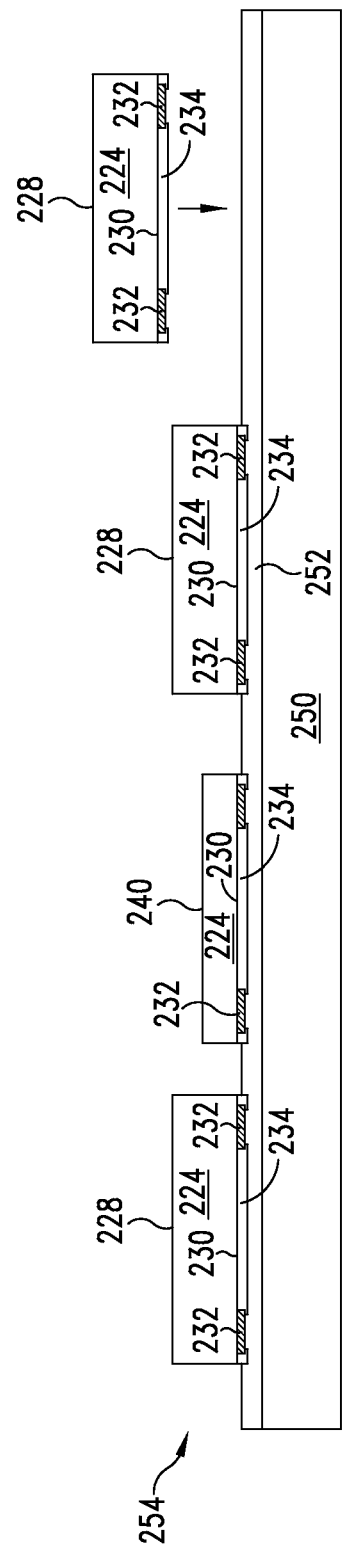

FIGS. 12a-12j illustrate, in relation to FIGS. 1 and 11a-11e, a process of forming a semiconductor package including a combination cover, composite cover, or thermal lid for thermal and warpage management. FIG. 12a shows a cross-sectional view of a portion of a carrier or temporary substrate 250 containing sacrificial base material such as silicon, polymer, beryllium oxide, glass, or other suitable low-cost, rigid material for structural support. An interface layer or double-sided tape 252 is formed over carrier 250 as a temporary adhesive bonding film, etch-stop layer, or thermal release layer.

Carrier 250 can be a round or rectangular panel (greater than 300 mm) with capacity for multiple semiconductor die 224. Carrier 250 may have a larger surface area than the surface area of semiconductor wafer 220. A larger carrier reduces the manufacturing cost of the semiconductor package as more semiconductor die can be processed on the larger carrier thereby reducing the cost per unit. Semiconductor packaging and processing equipment are designed and configured for the size of the wafer or carrier being processed.

To further reduce manufacturing costs, the size of carrier 250 is selected independent of the size of semiconductor die 224 or size of semiconductor wafer 220. That is, carrier 250 has a fixed or standardized size, which can accommodate various size semiconductor die 224 singulated from one or more semiconductor wafers 220. In one embodiment, carrier 250 is circular with a diameter of 330 mm. In another embodiment, carrier 250 is rectangular with a width of 560 mm and length of 600 mm. Semiconductor die 224 may have dimensions of 10 mm by 10 mm, which are placed on the standardized carrier 250. Alternatively, semiconductor die 224 may have dimensions of 20 mm by 20 mm, which are placed on the same standardized carrier 250. Accordingly, standardized carrier 250 can handle any size semiconductor die 224, which allows subsequent semiconductor processing equipment to be standardized to a common carrier, i.e., independent of die size or incoming wafer size. Semiconductor packaging equipment can be designed and configured for a standard carrier using a common set of processing tools, equipment, and bill of materials to process any semiconductor die size from any incoming wafer size. The common or standardized carrier 250 lowers manufacturing costs and capital risk by reducing or eliminating the need for specialized semiconductor processing lines based on die size or incoming wafer size. By selecting a predetermined carrier size to use for any size semiconductor die from all semiconductor wafer, a flexible manufacturing line can be implemented.

In FIG. 12a, semiconductor die 224 from FIG. 11e are mounted to interface layer 252 and over carrier 250 using, for example, a pick and place operation with active surface 230 oriented toward the carrier. FIG. 12a shows semiconductor die 224 mounted to interface layer 252 of carrier 250 as reconstituted or reconfigured wafer 254.

Reconstituted wafer 254 can be processed into many types of semiconductor packages, including eWLB, fan-in WLCSP, reconstituted or embedded wafer level chip scale packages (eWLCSP), fan-out WLCSP, flipchip packages, three dimensional (3D) packages, package-on-package (PoP), or other semiconductor packages. Reconstituted wafer 254 is configured according to the specifications of the resulting semiconductor package. In one embodiment, semiconductor die 224 are placed on carrier 250 in a high-density arrangement, i.e., 300 μm apart or less, for processing fan-in devices. In another embodiment, semiconductor die 224 are separated by a distance of 50 μm on carrier 250. The distance between semiconductor die 224 on carrier 250 is optimized for manufacturing the semiconductor packages at the lowest unit cost. The larger surface area of carrier 250 accommodates more semiconductor die 224 and lowers manufacturing cost as more semiconductor die 224 are processed per reconstituted wafer 254. The number of semiconductor die 224 mounted to carrier 250 can be greater than the number of semiconductor die 224 singulated from semiconductor wafer 220. Carrier 250 and reconstituted wafer 254 provide the flexibility to manufacture many different types of semiconductor packages using different size semiconductor die 224 from different sized semiconductor wafers 220.

In FIG. 12b, an encapsulant or molding compound 256 is deposited over semiconductor die 224 and carrier 250 as an insulating material using a paste printing, compressive molding, transfer molding, liquid encapsulant molding, vacuum lamination, spin coating, or other suitable applicator. In particular, encapsulant 256 covers the side surfaces and back surface 228 or 240 of semiconductor die 224. Encapsulant 256 can be polymer composite material, such as epoxy resin with filler, epoxy acrylate with filler, or polymer with proper filler. Encapsulant 256 is non-conductive and environmentally protects the semiconductor device from external elements and contaminants.

In FIG. 12c, carrier 250 and interface layer 252 are removed by chemical etching, mechanical peeling, CMP, mechanical grinding, thermal bake, UV light, laser scanning, or wet stripping to expose conductive layer 232 and insulating layer 234 over active surface 230 of semiconductor die 224.

In FIG. 12d, a build-up interconnect structure 260 is formed over semiconductor die 224 and encapsulant 256. An insulating or passivation layer 262 is formed over semiconductor die 224 and encapsulant 256 using PVD, CVD, printing, slit coating, spin coating, spray coating, injection coating, lamination, sintering or thermal oxidation. Insulating layer 262 contains one or more layers of SiO2, Si3N4, SiON, Ta2O5, Al2O3, polymer dielectric resist with or without fillers or fibers, low temperature (<250° C.) curable polymer photoresist, such as BCB, PBO, or epoxy based photosensitive polymer dielectric, or other material having similar structural and insulating properties. A portion of insulating layer 262 is removed by an exposure or development process, LDA, etching, or other suitable process to form openings over conductive layer 232 of semiconductor die 224.

An electrically conductive layer or RDL 264 is formed over insulating layer 262 using a patterning and metal deposition process such as sputtering, electrolytic plating, and electroless plating. Conductive layer 264 can be one or more layers of Al, Ti, TiW, Cu, Sn, Ni, Au, Ag, W, or other suitable electrically conductive material. One portion of conductive layer 264 is electrically connected to contact pads 232 of semiconductor die 224. Other portions of conductive layer 264 can be electrically common or electrically isolated depending on the design and function of semiconductor die 224.

An insulating or passivation layer 266 is formed over insulating layer 262 and conductive layer 264 using PVD, CVD, printing, slit coating, spin coating, spray coating, injection coating, lamination, sintering, or thermal oxidation. Insulating layer 266 contains one or more layers of SiO2, Si3N4, SiON, Ta2O5, Al2O3, polymer dielectric resist with or without fillers or fibers, low temperature (<250° C.) curable polymer photoresist, such as BCB, PBO, or epoxy based photosensitive polymer dielectric, or other material having similar structural and insulating properties. A portion of insulating layer 266 can be removed by an exposure or development process, LDA, etching, or other suitable process to expose conductive layer 264.

An electrically conductive layer 268 is optionally formed over the exposed portion of conductive layer 264 and over insulating layer 266 after final repassivation using PVD, CVD, evaporation, electrolytic plating, electroless plating, or other suitable metal deposition process. Conductive layer 268 can be Al, Ti, TiW, Cu, Sn, Ni, Au, Ag, W, or other suitable electrically conductive material. Conductive layer 268 operates as an under bump metallization (UBM) electrically connected to conductive layer 264. UBM 268 can be a multi-metal stack with adhesion layer, barrier layer, and seed or wetting layer. The adhesion layer is formed over conductive layer 264 and can be titanium nitride (TiN), Ti, TiW, Al, or chromium (Cr). The barrier layer is formed over the adhesion layer and can be tantalum nitride (TaN), nickel vanadium (NiV), platinum (Pt), palladium (Pd), Ni, TiW, Ti, or chromium copper (CrCu). The barrier layer inhibits the diffusion of Cu into the active area of semiconductor die 224. The seed layer is formed over the barrier layer and can be Cu, Ni, NiV, Au, or Al. UBM 268 provides a low resistive interconnect to conductive layer 264, as well as a barrier to solder diffusion and seed layer for solder wettability.

An electrically conductive bump material is deposited over conductive layer 268 using an evaporation, electrolytic plating, electroless plating, ball drop, or screen printing process. In one embodiment, the bump material is deposited with a ball drop stencil, i.e., no mask required. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 268 using a suitable attachment or bonding process. In one embodiment, the bump material is reflowed by heating the material above its melting point to form balls or bumps 270. In some applications, bumps 270 are reflowed a second time to improve electrical contact to conductive layer 268. Bumps 270 can also be compression bonded or thermocompression bonded to conductive layer 268. Bumps 270 represent one type of interconnect structure that can be formed over conductive layer 268. The interconnect structure can also use bond wires, conductive paste, stud bump, micro bump, or other electrical interconnect.

In FIG. 12e, a backgrinding or support tape 280 is applied over interconnect structure 260 and in contact with insulating layer 266 and bumps 270. A portion of encapsulant 256 is removed in a grinding operation with grinder 282 to planarize the surface of encapsulant 256 and expose back surface 228 of semiconductor die 224. A chemical etch or CMP process can also be used to planarize encapsulant 256 and to remove mechanical damage resulting from the grinding operation. The removal of a portion of encapsulant 256 leaves new back surface 284 of encapsulant 256.

FIG. 12f shows reconstituted wafer 254 after the backgrinding process. Back surface 228 of semiconductor die 224 is exposed by the backgrinding operation. Surface 284 of encapsulant 256 and back surface 228 of semiconductor die 224 may undergo a polishing step to remove damage to base material 222 of semiconductor die 224. Back surface 240 of semiconductor die 224, having a reduced height with respect to adjacent semiconductor die 224, remains covered by encapsulant 256.

Figure 12G:
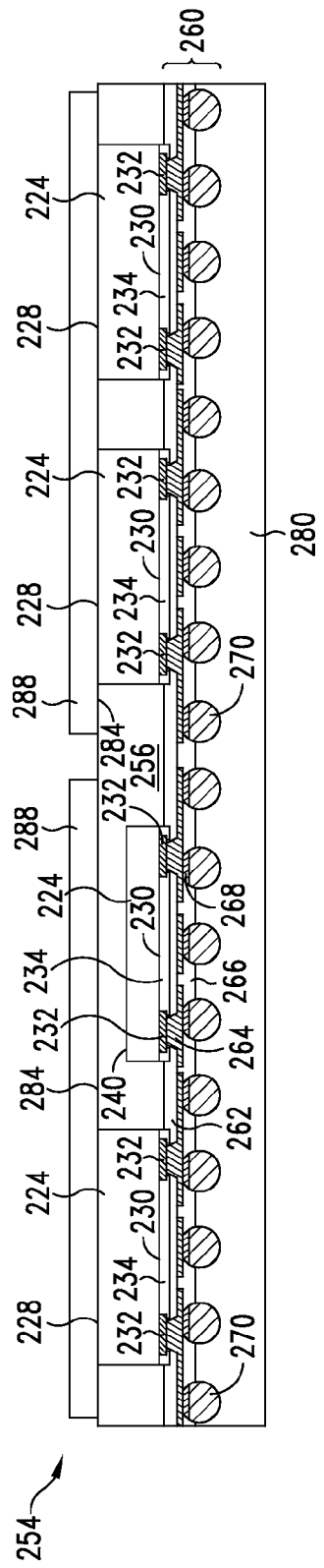

In FIG. 12g, a TIM 288 is deposited over back surface 228 of semiconductor die 224 and over surface 284 of encapsulant 256. TIM 288 is disposed over the individual semiconductor packages within reconstituted wafer 254. TIM 288 is a thermal epoxy, thermal epoxy resin, thermal conductive paste, aluminum oxide, zinc oxide, boron nitride, pulverized silver, or thermal grease. Alternatively, TIM 288 includes an electrically and thermally conductive material, such as Al, Cu, Sn, Ni, Au, Ag, or other suitable conductive material. TIM 288 may be electrically connected to interconnect structure 260 through semiconductor die 224 or a conductive via formed through encapsulant 256.

Figure 12H:
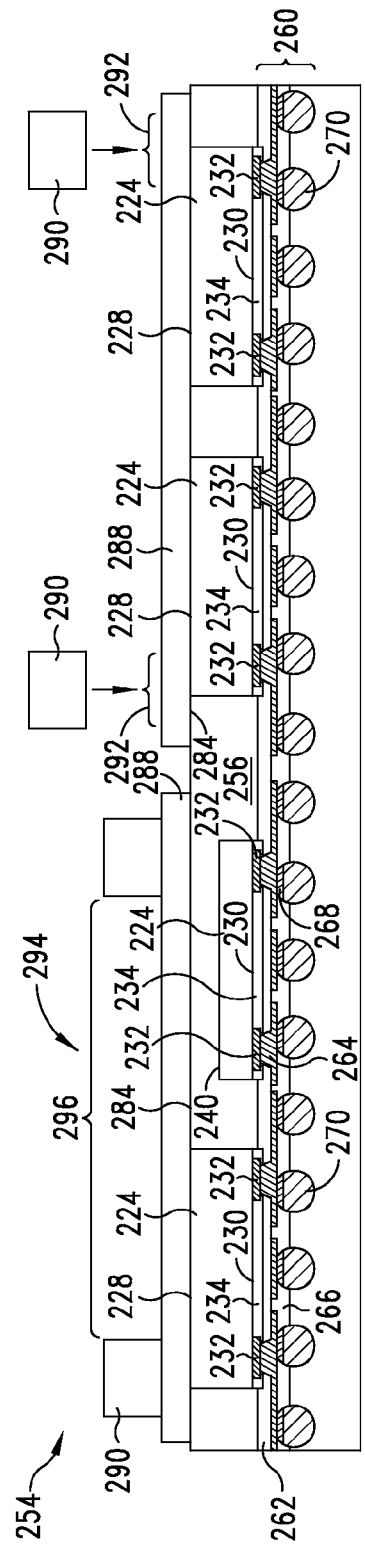

In FIG. 12h, a stiffener or stiffening layer 290 is mounted over TIM 288 near an edge area 292 of each semiconductor package. Stiffener 290 may be a metal having a low thermal conductivity or another material having low thermal conductivity. Alternatively, stiffener 290 may be a sacrificial base material such as silicon, polymer, beryllium oxide, glass, or other suitable low-cost, rigid material. Stiffener 290 includes an opening 294 over a central area 296 of each individual semiconductor package within reconstituted wafer 254. Stiffener 290 is disposed over encapsulant 256 and TIM 288 at edge area 292 and may be disposed over semiconductor die 224 or a portion of semiconductor die 224. In one embodiment, stiffener 290 has a CTE of less than 10 ppm/° C. and a thermal conductivity of less than 60 W/m·K.

In FIG. 12i, a heat spreader or heat sink 298 is positioned over and mounted to TIM 288 over back surface 228 of semiconductor die 224. Heat spreader 298 is mounted within opening 294 of stiffener 290 over central area 296 of each individual semiconductor package. Heat spreader 298 can be Cu, Al, or other material with high thermal conductivity (60 W/m·K or greater). Heat spreader 298 is disposed over encapsulant 256 and TIM 288 at central area 296 and may be disposed over semiconductor die 224 or a portion of semiconductor die 224. Heat spreader 298 and stiffener 290 together form a combination cover or layer 300 for each semiconductor package. In one embodiment, a gap 302 remains between heat spreader 298 and stiffener 290 for stress relief and improved thermal performance of combination cover 300. TIM 288 is cured to attach stiffener 290 and heat spreader 298 to TIM 288 and to semiconductor die 224 and encapsulant 256. A CTE of stiffener 290 is less than a CTE of heat spreader 298. In one embodiment, the material selected for heat spreader 298 has a CTE of greater than 14 ppm/° C. and a thermal conductivity of 60 W/m·K or greater. In another embodiment, heat spreader 298 is electrically and thermally connected to TIM 288 and interconnect structure 260.

In FIG. 12j, reconstituted wafer 254 is singulated through encapsulant 256 and interconnect structure 260 with saw blade or laser cutting tool 304 into individual semiconductor packages, FO-WLCSPs 306 and 308. FO-WLCSPs 306 and 308 undergo electrical testing before or after singulation. In one embodiment, the semiconductor package may include a multi-die package with each semiconductor die 224 having the same height, such as FO-WLCSP 306. In another embodiment, the multi-die package may include semiconductor die 224 having different heights, such as FO-WLCSP 308. In yet another embodiment, the semiconductor package is similar to FO-WLCSPs 306 and 308, but includes a single semiconductor die 224 rather than multiple semiconductor die 224.

FIG. 13a shows FO-WLCSP 306 from FIG. 12j after singulation. FO-WLCSP 306 includes one or more semiconductor die 224 embedded in encapsulant 256. Interconnect structure 260 is formed over active surface 230 of semiconductor die 224 and over encapsulant 256 to provide electrical interconnect extending outside a footprint of semiconductor die 224. TIM 288 is formed over a portion of semiconductor die 224 and encapsulant 256. Combination cover 300 includes stiffener 290 and heat spreader 298 disposed over TIM 288. TIM 288 and heat spreader 298 form a thermally conductive path that aids with distribution and dissipation of heat generated by semiconductor die 224 and improves the thermal performance of FO-WLCSP 306. Combination cover 300 increases the package strength of FO-WLCSP 306 by providing structural support. The combination of stiffener 290, including a low CTE, and heat spreader 298, including high thermal conductivity, provides a balance of warpage and thermal performance. Stiffener 290 including a low CTE (less than 10 ppm/° C.) reduces the effective CTE of combination cover 300 to less than 14 ppm/° C. Thus, stiffener 290 improves warpage behavior of FO-WLCSP 306, while heat spreader 298 including a thermal conductivity of 60 W/m·K or greater maintains the beneficial heat dissipation characteristics for FO-WLCSP 306. Combination cover 300 further includes a thickness selected to ensure FO-WLCSP 306 remains within the height specifications for the final semiconductor package. Combination cover 300 avoids the need for expensive materials, and therefore reduces the cost to manufacture a high performance FO-WLCSP.

FIG. 13b shows a plan view of FO-WLCSP 306 from FIG. 13a. Combination cover 300 is shown including heat spreader 298 surrounded in a peripheral region by stiffener 290. Stiffener 290 is disposed over edge area 292 of FO-WLCSP 306. In one embodiment, stiffener 290 is shaped as a continuous frame formed completely around edge area 292 of FO-WLCSP 306 and includes a central opening 294. The position or configuration of stiffener 290 provides structural support for each semiconductor package, while the material of stiffener 290 reduces warpage of FO-WLCSP 306. Heat spreader 298 is disposed adjacent to stiffener 290 and over central area 296 of FO-WLCSP 306 within opening 294 of stiffener 290. The warpage effect caused by the high CTE (greater than 14 ppm/° C.) of heat spreader 298 is mitigated by the lower CTE of stiffener 290. Thus, FO-WLCSP 306 exhibits balanced thermal performance with good warpage behavior and thermal conductivity.

Figure 13C:
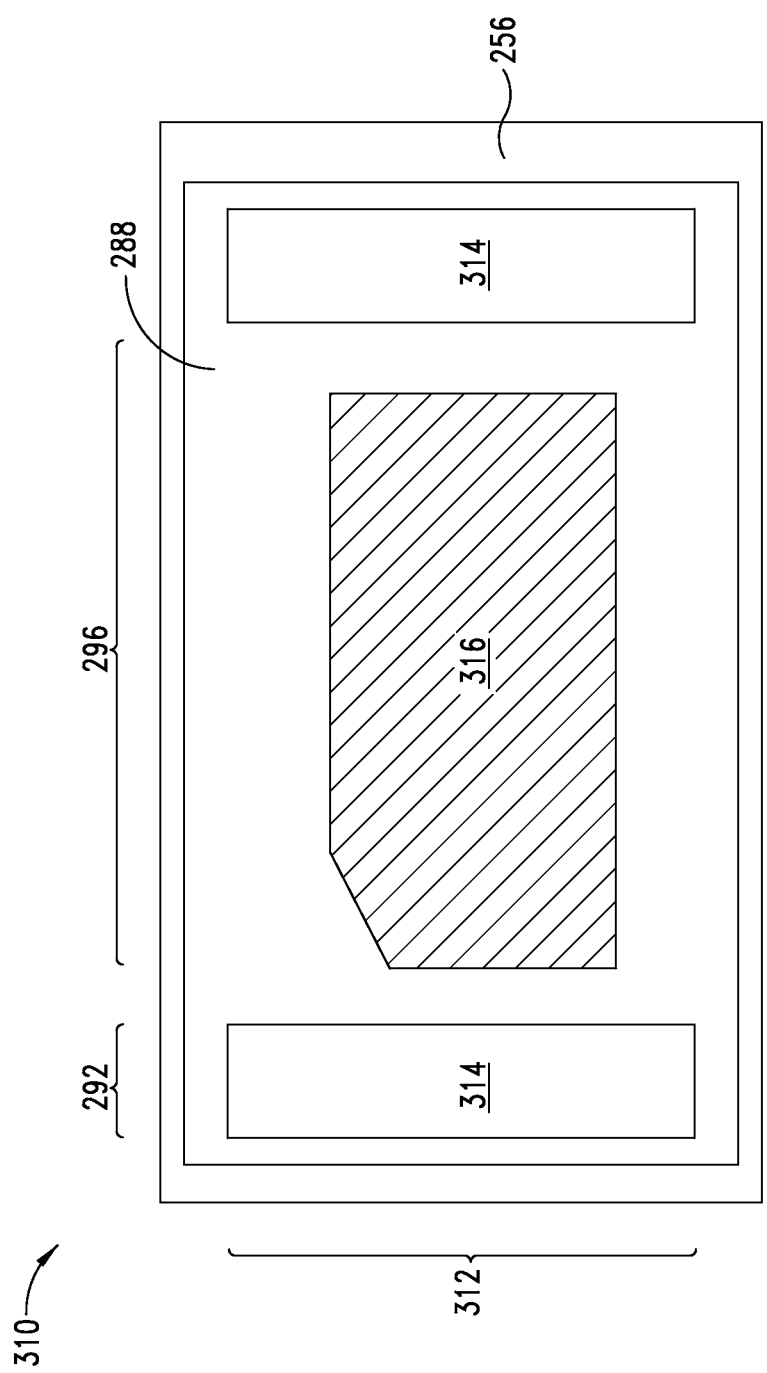

FIG. 13c shows a plan view of an alternative FO-WLCSP 310 including combination cover or layer 312. Combination cover 312 includes stiffener or stiffening layer 314 mounted over TIM 288 near an edge area 292 of FO-WLCSP 310. Stiffener 314 may be a metal having a low thermal conductivity or another material having low thermal conductivity. Alternatively, stiffener 314 may be a sacrificial base material such as silicon, polymer, beryllium oxide, glass, or other suitable low-cost, rigid material. In one embodiment, stiffener 314 is pre-formed as a plurality of blocks, strips, or portions and is disposed over TIM 288. Stiffener 314 is formed along one or more edge areas 292 of FO-WLCSP 310, while central area 296 remains uncovered with respect to stiffener 314. In one embodiment, stiffener 314 has a CTE of less than 10 ppm/° C. and a thermal conductivity of less than 60 W/m·K.

Combination cover 312 further includes a heat spreader or heat sink 316 positioned over and mounted to TIM 288 over back surface 228 of semiconductor die 224. Heat spreader 316 is mounted between portions of stiffener 314 over central area 296 of FO-WLCSP 310. Heat spreader 316 can be Cu, Al, or other material with high thermal conductivity (60 W/m·K or greater). Heat spreader 316 and stiffener 314 together form combination cover 312 disposed over FO-WLCSP 310. TIM 288 is cured to attach stiffener 314 and heat spreader 316 to TIM 288 and to semiconductor die 224 and encapsulant 256. TIM 288 and heat spreader 316 form a thermally conductive path that aids with distribution and dissipation of heat generated by semiconductor die 224 and improves the thermal performance of FO-WLCSP 310. In one embodiment, the material selected for heat spreader 316 has a CTE of greater than 14 ppm/° C. and a thermal conductivity of 60 W/m·K or greater.

Combination cover 312 increases the package strength of FO-WLCSP 310, because stiffener 314 and heat spreader 316 provide structural support. The position or configuration of stiffener 314 provides structural support for each semiconductor package, while the material of stiffener 314 reduces warpage of FO-WLCSP 310. The combination of stiffener 314, including a low CTE, and heat spreader 316, including high thermal conductivity, provides a balance of warpage and thermal performance. The warpage effect caused by the high CTE (greater than 14 ppm/° C.) of heat spreader 316 is mitigated by the lower CTE of stiffener 314. Stiffener 314 including a low CTE (less than 10 ppm/° C.) reduces the effective CTE of combination cover 312 to less than 14 ppm/° C. Thus, stiffener 314 improves warpage behavior of FO-WLCSP 310, while heat spreader 316, including a thermal conductivity of 60 W/m·K or greater, maintains the beneficial heat dissipation characteristics for FO-WLCSP 310. FO-WLCSP 310 exhibits balanced thermal performance with good warpage behavior and thermal conductivity. Combination cover 312 further includes a thickness selected to ensure FO-WLCSP 310 remains within the height specifications for the final semiconductor package. Combination cover 312 avoids the need for expensive materials for heat dissipation, and therefore reduces the cost to manufacture a high performance FO-WLCSP.

Figure 13D:
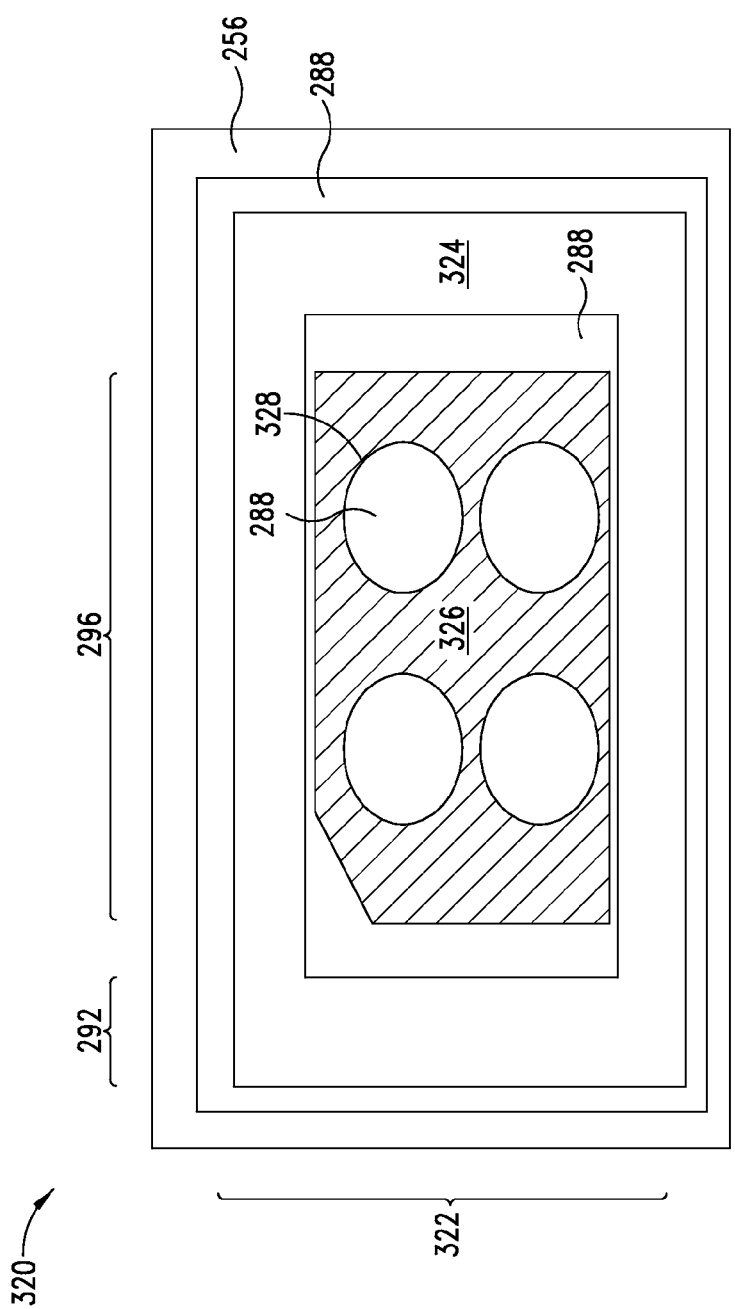

FIG. 13d shows a plan view of an alternative FO-WLCSP 320 including combination cover 322. Combination cover 322 includes stiffener or stiffening layer 324 mounted over TIM 288 near an edge area 292 of each semiconductor package. Stiffener 324 is formed along one or more edge areas 292 of FO-WLCSP 320, while central area 296 remains uncovered with respect to stiffener 324. In one embodiment, stiffener 324 is shaped as a continuous frame formed completely around edge area 292 of FO-WLCSP 320 and includes a central opening. In one embodiment, stiffener 324 has a CTE of less than 10 ppm/° C. and a thermal conductivity of less than 60 W/m~K.

Combination cover 322 further includes a heat spreader or heat sink 326 positioned over and mounted to TIM 288 over back surface 228 of semiconductor die 224. Heat spreader 326 is mounted within an opening of stiffener 324 over central area 296 of FO-WLCSP 320. Heat spreader 326 can be Cu, Al, or other material with high thermal conductivity (60 W/m·K or greater). Heat spreader 326 includes a mesh structure with a plurality of openings 328. TIM 288 is cured to attach stiffener 324 and heat spreader 326 to TIM 288 and to semiconductor die 224 and encapsulant 256. TIM 288 and heat spreader 326 form a thermally conductive path that aids with distribution and dissipation of heat generated by semiconductor die 224 and improves the thermal performance of FO-WLCSP 320. In one embodiment, the material selected for heat spreader 326 includes a CTE of greater than 14 ppm/° C. and a thermal conductivity of 60 W/m·K or greater.

Combination cover 322 increases the package strength of FO-WLCSP 320, because stiffener 324 and heat spreader 326 provide structural support. The position or configuration of stiffener 324 provides structural support for each semiconductor package, while the material of stiffener 324 reduces warpage of FO-WLCSP 320. The combination of stiffener 324, including a low CTE, and heat spreader 326, including high thermal conductivity, provides a balance of warpage and thermal performance. The warpage effect caused by the high CTE (greater than 14 ppm/° C.) of the material of heat spreader 326 is mitigated by the lower CTE of stiffener 324 and by openings 328 in heat spreader 326. Openings 328 result in improved warpage behavior of heat spreader 326 by reducing the effective CTE of heat spreader 326. In one embodiment, openings 328 have a size and shape which reduces the effective CTE of heat spreader 326 to within a range of approximately 6-12 ppm/° C. Additionally, stiffener 324 including a low CTE (less than 10 ppm/° C.) reduces the effective CTE of combination cover 322 to less than 14 ppm/° C. Thus, stiffener 324 improves warpage behavior of FO-WLCSP 320, while heat spreader 326, including a thermal conductivity of 60 W/m·K or greater, maintains the beneficial heat dissipation characteristics for FO-WLCSP 320. FO-WLCSP 320 exhibits balanced thermal performance with good warpage behavior and thermal conductivity. Combination cover 322 further includes a thickness selected to ensure FO-WLCSP 320 remains within the height specifications for the final semiconductor package. Combination cover 322 avoids the need for expensive materials for heat dissipation, and therefore reduces the cost to manufacture a high performance FO-WLCSP.

FIGS. 14a-14d show an alternative process of making a semiconductor package including a heat spreader for thermal and warpage control. Continuing from FIG. 12g, FIG. 14a shows a heat spreader or heat sink 340 positioned over and mounted to TIM 288 over back surface 228 of semiconductor die 224 and surface 284 of encapsulant 256. Heat spreader 340 can be Cu, Al, or other material with high thermal conductivity. Heat spreader 340 includes a mesh structure with a plurality of openings 342. In one embodiment, the material selected for heat spreader 340 includes a thermal conductivity of 60 W/m·K or greater.

In FIG. 14b, reconstituted wafer 254 including semiconductor die 224 is singulated through encapsulant 256 and interconnect structure 260 with saw blade or laser cutting tool 344 into individual eWLCSP 346 and 348. FO-WLCSPs 346 and 348 undergo electrical testing before or after singulation. In one embodiment, the semiconductor package may include a multi-die package with each semiconductor die 224 having the same height, such as FO-WLCSP 346. In another embodiment, the multi-die package may include semiconductor die 224 having different heights, such as FO-WLCSP 348. In yet another embodiment, the semiconductor package includes a single semiconductor die 224.

FIG. 14c shows FO-WLCSP 348 after singulation. FO-WLCSP 348 includes one or more semiconductor die 224 embedded in encapsulant 256. Interconnect structure 260 is formed over active surface 230 of semiconductor die 224 and over encapsulant 256 to provide electrical interconnect extending outside a footprint of semiconductor die 224. TIM 288 is formed over a portion of semiconductor die 224 and encapsulant 256. Heat spreader 340 is disposed over TIM 288. TIM 288 and heat spreader 340 form a thermally conductive path that aids with distribution and dissipation of heat generated by semiconductor die 224 and improves the thermal performance of FO-WLCSP 348. Heat spreader 340 provides structural support and a balance of warpage and thermal performance.

FIG. 14d shows a plan view of FO-WLCSP 348 from FIG. 14c. Heat spreader 340 having a mesh structure is shown in FIG. 14d. Openings 342 are formed in heat spreader 340 to separate an edge portion 350 and a central portion 352 of heat spreader 340. Edge portion 350 and central portion 352 remain connected by connecting portions 354 to form a continuous mesh of heat spreader 340. Openings 342 result in improved warpage behavior of heat spreader 340 by reducing the effective CTE of heat spreader 340. In one embodiment, openings 342 have a size and shape which reduces the effective CTE of heat spreader 340 to within a range of approximately 6-12 ppm/° C. The effective thermal conductivity of heat spreader 340 remains approximately 60 W/m·K or greater. Thus, the configuration of heat spreader 340 improves warpage behavior of FO-WLCSP 348 while heat spreader 340 also has sufficient thermal conductivity to maintain the beneficial heat dissipation characteristics for FO-WLCSP 348. Heat spreader 340 further includes a thickness selected to ensure FO-WLCSP 348 remains within the height specifications for the final semiconductor package. Heat spreader 340 avoids the need for expensive materials for heat dissipation, and therefore reduces the cost to manufacture a high performance FO-WLCSP.

FIGS. 15a-15d show alternative heat spreaders for balancing package warpage and thermal conductivity. FIG. 15a shows a plan view of semiconductor package or FO-WLCSP 360. Semiconductor package 360 is similar to FO-WLCSPs 346 or 348 from FIG. 14b, and includes a heat spreader 362 having openings 364. Heat spreader or heat sink 362 is positioned over and mounted to TIM 288 over back surface 228 of semiconductor die 224. Heat spreader 362 can be Cu, Al, or other material with high thermal conductivity (60 W/m·K or greater). TIM 288 is cured to attach heat spreader 362 to TIM 288 and to semiconductor die 224 and encapsulant 256. Heat spreader 362 includes a mesh structure with a plurality of openings 364 formed in heat spreader 362 over a central area 296 of semiconductor package 360. Openings 364 result in improved warpage behavior of heat spreader 362 by reducing the effective CTE of heat spreader 362. In one embodiment, openings 364 have a size and shape which reduces the effective CTE of heat spreader 362 to within a range of approximately 6-12 ppm/° C. The effective thermal conductivity of heat spreader 362 including openings 364 remains approximately 60 W/m·K or greater. Thus, the configuration of heat spreader 362 improves warpage behavior of semiconductor package 360 while heat spreader 362 also has sufficient thermal conductivity to maintain the beneficial heat dissipation characteristics for semiconductor package 360. Heat spreader 362 further includes a thickness selected to ensure semiconductor package 360 remains within the height specifications for the final semiconductor package. Heat spreader 362 avoids the need for expensive materials for heat dissipation, and therefore reduces the cost to manufacture a high performance semiconductor package.

FIG. 15b shows a plan view of semiconductor package or FO-WLCSP 370. Semiconductor package 370 is similar to FO-WLCSPs 346 and 348 from FIG. 14b, but includes a heat spreader 372 having extended corners 374 and recesses 376. Heat spreader or heat sink 372 is positioned over and mounted to TIM 288 over back surface 228 of semiconductor die 224. Heat spreader 372 can be Cu, Al, or other material with high thermal conductivity (60 W/m·K or greater). TIM 288 is cured to attach heat spreader 372 to TIM 288. Heat spreader 372 includes extended corners 374 disposed over the corners of semiconductor package 370 and includes recesses 376 disposed at edge area 292 of semiconductor package 370. Portions of edge area 292 of semiconductor package 370 remain uncovered with respect to heat spreader 372. Extended corners 374 provide support semiconductor package 370 to increase the strength of semiconductor package 370. Recesses 376 result in improved warpage behavior of heat spreader 372 by reducing the effective CTE of heat spreader 372. In one embodiment, recesses 376 and extended corners 374 are configured to reduce the effective CTE of heat spreader 372 to within a range of approximately 6-12 ppm/° C. The effective thermal conductivity of heat spreader 372 including recesses 376 and extended corners 374 remains approximately 60 W/m·K or greater. Thus, the configuration of heat spreader 372 improves warpage behavior of semiconductor package 370 while heat spreader 372 also has sufficient thermal conductivity to maintain the beneficial heat dissipation characteristics for semiconductor package 370. Heat spreader 372 further includes a thickness selected to ensure semiconductor package 370 remains within the height specifications for the final semiconductor package. Heat spreader 372 avoids the need for expensive materials for heat dissipation, and therefore reduces the cost to manufacture a high performance semiconductor package.

FIG. 15c shows a plan view of semiconductor package or FO-WLCSP 380. Semiconductor package 380 is similar to FO-WLCSPs 346 and 348 from FIG. 14b, but includes a heat spreader 382 having extended corners 384, recesses 386, and openings 388. Heat spreader or heat sink 382 is positioned over and mounted to TIM 288 over back surface 228 of semiconductor die 224. Heat spreader 382 can be Cu, Al, or other material with high thermal conductivity (60 W/m·K or greater). TIM 288 is cured to attach heat spreader 382 to TIM 288. Heat spreader 382 includes extended corners 384 disposed over the corners of semiconductor package 380 and recesses 386 disposed at edge area 292 of semiconductor package 380. Portions of edge area 292 of semiconductor package 380 remain uncovered with respect to heat spreader 382. Extended corners 384 provide support for semiconductor package 380 to increase the strength of semiconductor package 380. Recesses 386 result in improved warpage behavior of heat spreader 382 by reducing the effective CTE of heat spreader 382.

Heat spreader 382 includes a mesh structure with openings 388 formed in heat spreader 382 over a central area 296 of semiconductor package 380. Openings 388 result in improved warpage behavior of heat spreader 382 by further reducing the effective CTE of heat spreader 382. In one embodiment, openings 388 have a size and shape which reduces the effective CTE of heat spreader 382 to within a range of approximately 6-12 ppm/° C. The effective thermal conductivity of heat spreader 382 including extended corners 384, recesses 386, and openings 388 remains approximately 60 W/m·K or greater. Thus, the configuration of heat spreader 382 improves warpage behavior of semiconductor package 380 while heat spreader 382 also has sufficient thermal conductivity to maintain the beneficial heat dissipation characteristics for semiconductor package 380. Heat spreader 382 further includes a thickness selected to ensure semiconductor package 380 remains within the height specifications for the final semiconductor package. Heat spreader 382 avoids the need for expensive materials for heat dissipation, and therefore reduces the cost to manufacture a high performance semiconductor package.

FIG. 15d shows a plan view of semiconductor package or FO-WLCSP 390. Semiconductor package 390 is similar to FO-WLCSPs 346 and 348 from FIG. 14b, but includes a heat spreader 392 having a leaf shape. Heat spreader or heat sink 392 is positioned over and mounted to TIM 288 over back surface 228 of semiconductor die 224. Heat spreader 392 can be Cu, Al, or other material with high thermal conductivity (60 W/m·K or greater). TIM 288 is cured to attach heat spreader 392 to TIM 288. Heat spreader 392 includes quadrants 394 disposed over semiconductor package 390. Quadrants 394 are defined by recesses 396 extending from an edge area 292 toward a center of heat spreader 392. Quadrants 394 provide support for semiconductor package 390 to increase the strength of semiconductor package 390. Recesses 396 result in improved warpage behavior of heat spreader 392 by providing stress relief. In one embodiment, the effective CTE of heat spreader 392 is within a range of approximately 6-12 ppm/° C., and the effective thermal conductivity is approximately 60 W/m·K or greater. Thus, the configuration of heat spreader 392 improves warpage behavior of semiconductor package 390 while heat spreader 392 also has sufficient thermal conductivity to maintain the beneficial heat dissipation characteristics for semiconductor package 390. Heat spreader 392 further includes a thickness selected to ensure semiconductor package 390 remains within the height specifications for the final semiconductor package. Heat spreader 392 avoids the need for expensive materials for heat dissipation, and therefore reduces the cost to manufacture a high performance semiconductor package.

Figure 16:
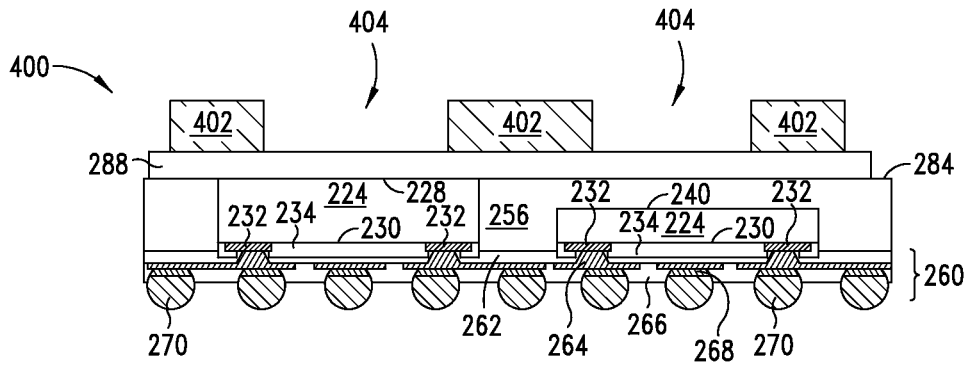
FIG. 16 illustrates a FO-WLCSP with a heat spreader disposed over multiple semiconductor die.

FIG. 16 shows another semiconductor package or FO-WLCSP 400 similar to FO-WLCSP 348 from FIG. 14c. FIG. 16 shows an alternative heat spreader or heat sink 402. Heat spreader 402 is positioned over and mounted to TIM 288 over back surface 228 of semiconductor die 224. Heat spreader 402 can be Cu, Al, or other material with high thermal conductivity (60 W/m·K or greater). Heat spreader 402 includes a mesh structure with openings 404. Portions of heat spreader 402 are disposed over a footprint of semiconductor die 224, and openings 404 may also be disposed over a footprint of semiconductor die 224.

TIM 288 is cured to attach heat spreader 402 to TIM 288 and to semiconductor die 224 and encapsulant 256. TIM 288 and heat spreader 402 form a thermally conductive path that aids with distribution and dissipation of heat generated by semiconductor die 224 and improves the thermal performance of FO-WLCSP 400. Openings 404 result in improved warpage behavior of heat spreader 402 by reducing the effective CTE of heat spreader 402. In one embodiment, openings 404 have a size and shape which reduces the effective CTE of heat spreader 402 to within a range of approximately 6-12 ppm/° C. The effective thermal conductivity of heat spreader 402 including openings 404 remains approximately 60 W/m·K or greater.

Figure 17A:
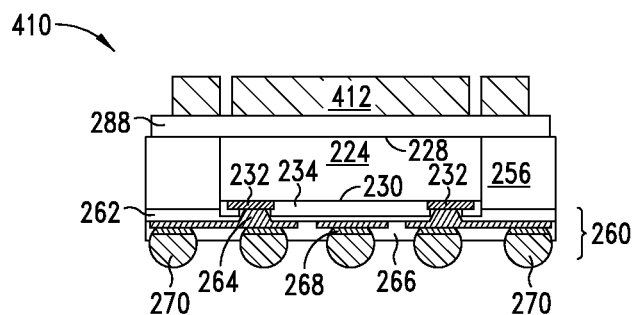
FIGS. 17a-17b illustrate alternative FO-WLCSPs with a heat spreader.
Figure 17B:
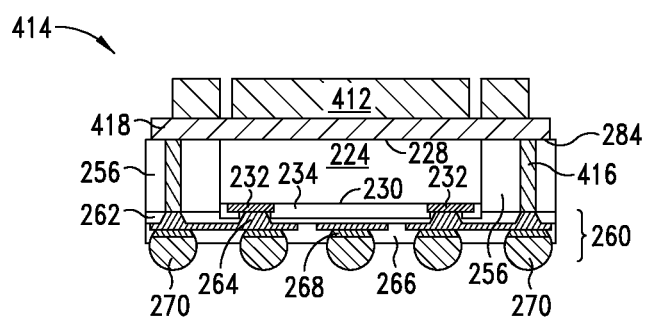

FIGS. 17a-17b illustrate alternative FO-WLCSPs with a heat spreader. FIG. 17a shows a semiconductor package or FO-WLCSP 410, similar to FO-WLCSPs 346 and 348 from FIG. 14c, and having heat spreader 412 disposed over a single semiconductor die 224. Heat spreader or heat sink 412 is positioned over and mounted to TIM 288 over back surface 228 of semiconductor die 224. Heat spreader 412 can be Cu, Al, or other material with high thermal conductivity (60 W/m·K or greater). Heat spreader 412 may include a combination stiffener and heat spreader, as shown in FIGS. 13b-13d, or a uniform material including a structure according to FIGS. 15a-15d. TIM 288 is cured to attach heat spreader 412 to TIM 288 and to semiconductor die 224 and encapsulant 256. TIM 288 and heat spreader 412 form a thermally conductive path that aids with distribution and dissipation of heat generated by semiconductor die 224 and improves the thermal performance of FO-WLCSP 410. In one embodiment, heat spreader 412 is configured with a size and shape to reduce the effective CTE of heat spreader 412 to within a range of 6-12 ppm/° C. The effective thermal conductivity of heat spreader 412 remains approximately 60 W/m·K or greater. Thus, the configuration of heat spreader 412 improves warpage behavior of FO-WLCSP 410 while heat spreader 412 also has sufficient thermal conductivity to maintain the beneficial heat dissipation characteristics for FO-WLCSP 410. Heat spreader 412 further includes a thickness selected to ensure FO-WLCSP 410 remains within the height specifications for the final semiconductor package. Heat spreader 412 avoids the need for expensive materials for heat dissipation, and therefore reduces the cost to manufacture a high performance FO-WLCSP.

FIG. 17b shows a semiconductor package or FO-WLCSP 414, similar to FO-WLCSP 410, including a plurality of conductive vias or conductive pillars 416. Conductive vias 416 are formed through encapsulant 256 around semiconductor die 224. A plurality of through vias is formed through encapsulant 256 using laser drilling, mechanical drilling, or deep reactive ion etching (DRIE). The vias are filled with Al, Cu, Sn, Ni, Au, Ag, Ti, W, or other suitable electrically conductive material using electrolytic plating, electroless plating process, or other suitable deposition process to form z-direction vertical interconnect conductive vias 416. Alternatively, conductive pillars 416 are formed adjacent to semiconductor die 224 over carrier 250, and encapsulant 256 is deposited around semiconductor die 224 and conductive pillars 416.

A TIM 418 is deposited over back surface 228 of semiconductor die 224 and over surface 284 of encapsulant 256. TIM 418 includes a thermally and electrically conductive material, such as Al, Cu, Sn, Ni, Au, Ag, or other suitable conductive material. Heat spreader or heat sink 412 is positioned over and mounted to TIM 418 over back surface 228 of semiconductor die 224. Heat spreader 412 can be Cu, Al, or other material with high thermal conductivity (60 W/m·K or greater). Heat spreader 412 may include a combination stiffener and heat spreader, as shown in FIGS. 13b-13d, or a uniform material including a structure according to FIGS. 15a-15d. TIM 418 is cured to attach heat spreader 412 to TIM 418 and to semiconductor die 224 and encapsulant 256. In one embodiment, TIM 418 forms an electrically conductive path between heat spreader 412 and conductive vias 416 to interconnect structure 260 or to back surface 228 of semiconductor die 224. The electrically conductive path may connect heat spreader 412 to ground through interconnect structure 260. In another embodiment, TIM 418 thermally and electrically connects heat spreader 412 to conductive vias 416.

TIM 418 and heat spreader 412 form a thermally conductive path that aids with distribution and dissipation of heat generated by semiconductor die 224 and improves the thermal performance of FO-WLCSP 414. In one embodiment, heat spreader 412 is configured with a size and shape to reduce the effective CTE of heat spreader 412 to within a range of 6-12 ppm/° C. The effective thermal conductivity of heat spreader 412 remains approximately 60 W/m·K or greater. Thus, the configuration of heat spreader 412 improves warpage behavior of FO-WLCSP 414 while heat spreader 412 also has sufficient thermal conductivity to maintain the beneficial heat dissipation characteristics for FO-WLCSP 414. Heat spreader 412 further includes a thickness selected to ensure FO-WLCSP 414 remains within the height specifications for the final semiconductor package. Heat spreader 412 avoids the need for expensive materials for heat dissipation, and therefore reduces the cost to manufacture a high performance FO-WLCSP.

Figure 18I:
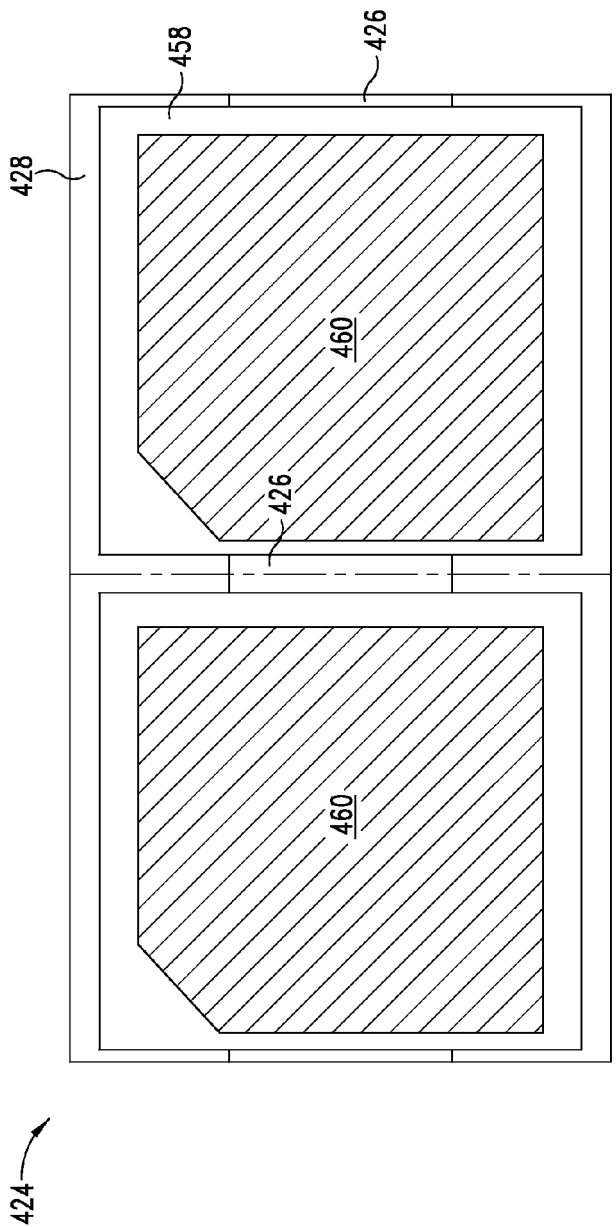

FIGS. 18a-18j illustrate, in relation to FIGS. 1 and 11a-11e, a process of forming a semiconductor package including a stiffener and heat spreader for thermal and warpage management. FIG. 18a shows a cross-sectional view of a portion of a carrier or temporary substrate 420 containing sacrificial base material such as silicon, polymer, beryllium oxide, glass, or other suitable low-cost, rigid material for structural support. An interface layer or double-sided tape 422 is formed over carrier 420 as a temporary adhesive bonding film, etch-stop layer, or thermal release layer.

Carrier 420 can be a round or rectangular panel (greater than 300 mm) with capacity for multiple semiconductor die 224. Carrier 420 may have a larger surface area than the surface area of semiconductor wafer 220. A larger carrier reduces the manufacturing cost of the semiconductor package as more semiconductor die can be processed on the larger carrier thereby reducing the cost per unit. Semiconductor packaging and processing equipment are designed and configured for the size of the wafer or carrier being processed.

To further reduce manufacturing costs, the size of carrier 420 is selected independent of the size of semiconductor die 224 or size of semiconductor wafer 220. That is, carrier 420 has a fixed or standardized size, which can accommodate various size semiconductor die 224 singulated from one or more semiconductor wafers 220. In one embodiment, carrier 420 is circular with a diameter of 330 mm. In another embodiment, carrier 420 is rectangular with a width of 560 mm and length of 600 mm. Semiconductor die 224 may have dimensions of 10 mm by 10 mm, which are placed on the standardized carrier 420. Alternatively, semiconductor die 224 may have dimensions of 20 mm by 20 mm, which are placed on the same standardized carrier 420. Accordingly, standardized carrier 420 can handle any size semiconductor die 224, which allows subsequent semiconductor processing equipment to be standardized to a common carrier, i.e., independent of die size or incoming wafer size. Semiconductor packaging equipment can be designed and configured for a standard carrier using a common set of processing tools, equipment, and bill of materials to process any semiconductor die size from any incoming wafer size. The common or standardized carrier 420 lowers manufacturing costs and capital risk by reducing or eliminating the need for specialized semiconductor processing lines based on die size or incoming wafer size. By selecting a predetermined carrier size to use for any size semiconductor die from all semiconductor wafer, a flexible manufacturing line can be implemented.

Semiconductor die 224 from FIG. 11e are mounted to interface layer 422 and over carrier 420 using, for example, a pick and place operation with active surface 230 oriented toward the carrier. FIG. 18a shows semiconductor die 224 mounted to interface layer 422 of carrier 420 as reconstituted or reconfigured wafer 424.

Reconstituted wafer 424 can be processed into many types of semiconductor packages, including eWLB, fan-in WLCSP, eWLCSP, fan-out WLCSP, flipchip packages, 3D packages, PoP, or other semiconductor packages. Reconstituted wafer 424 is configured according to the specifications of the resulting semiconductor package. In one embodiment, semiconductor die 224 are placed on carrier 420 in a high-density arrangement, i.e., 300 μm apart or less, for processing fan-in devices. In another embodiment, semiconductor die 224 are separated by a distance of 50 μm on carrier 420. The distance between semiconductor die 224 on carrier 420 is optimized for manufacturing the semiconductor packages at the lowest unit cost. The larger surface area of carrier 420 accommodates more semiconductor die 224 and lowers manufacturing cost as more semiconductor die 224 are processed per reconstituted wafer 424. The number of semiconductor die 224 mounted to carrier 420 can be greater than the number of semiconductor die 224 singulated from semiconductor wafer 220. Carrier 420 and reconstituted wafer 424 provide the flexibility to manufacture many different types of semiconductor packages using different size semiconductor die 224 from different sized semiconductor wafers 220.

A stiffener or stiffening layer 426 is formed over or mounted to interface layer 422 adjacent to semiconductor die 224 over carrier 420. Stiffening layer 426 can be sacrificial base material such as silicon, polymer, beryllium oxide, glass, or other suitable low-cost, rigid material for structural support. Alternatively, stiffening layer 426 can be ferrite or carbonyl iron, ceramic, Cu, Al, stainless steel, nickel silver, low-carbon steel, silicon-iron steel, foil, epoxy, conductive resin, and other metals and composites capable of blocking or absorbing EMI, RFI, and other inter-device interference. Stiffening layer 426 can include discrete components. Stiffening layer 426 can also be a non-metal material such as carbon-black or aluminum flake to reduce the effects of EMI and RFI. In one embodiment, stiffening layer 426 includes a material having a CTE of less than 6 ppm/° C. In another embodiment, stiffening layer 426 includes a multi-layer composite with a plurality of layers, such as metal, compliant material, or silicon.

In FIG. 18b, an encapsulant or molding compound 428 is deposited over semiconductor die 224 and carrier 420 as an insulating material using a paste printing, compressive molding, transfer molding, liquid encapsulant molding, vacuum lamination, spin coating, or other suitable applicator. In particular, encapsulant 428 covers the side surfaces and back surface 228 of semiconductor die 224. Encapsulant 428 can be polymer composite material, such as epoxy resin with filler, epoxy acrylate with filler, or polymer with proper filler. Encapsulant 428 is non-conductive and environmentally protects the semiconductor device from external elements and contaminants.

In FIG. 18c, carrier 420 and interface layer 422 are removed by chemical etching, mechanical peeling, CMP, mechanical grinding, thermal bake, UV light, laser scanning, or wet stripping to expose conductive layer 232 and insulating layer 234 over active surface 230. Encapsulant 428 and stiffening layer 426 are also exposed by the removal of carrier 420 and interface layer 422.

FIG. 18d shows a plan view of reconstituted wafer 424 from FIG. 18c. FIG. 18d shows a portion of reconstituted wafer 424 including two unsingulated semiconductor packages each having a plurality of semiconductor die 224. Stiffening layer 426 is shown disposed across the plurality of semiconductor packages. Stiffening layer 426 includes a length $L_1$ selected based on the length $L_2$ and width $W_2$ of one or more semiconductor die 224. In one embodiment, the length $L_1$ of stiffening layer 426 is less than the effective length $L_2$ of the plurality of semiconductor die 224, where a ratio of effective length $L_2$ to width $W_2$ of semiconductor die 224 is greater than 1. In another embodiment, stiffening layer 426 is disposed adjacent to both the length $L_2$ and width $W_2$ of semiconductor die 224. Stiffening layer 426 reduces unbalanced warpage in the x and y directions, i.e., in the directions of length $L_2$ and width $W_2$.

In FIG. 18e, a build-up interconnect structure 430 is formed over semiconductor die 224 and encapsulant 428. An insulating or passivation layer 432 is formed over semiconductor die 224 and encapsulant 428 using PVD, CVD, printing, slit coating, spin coating, spray coating, injection coating, lamination, sintering or thermal oxidation. Insulating layer 432 contains one or more layers of SiO2, Si3N4, SiON, Ta2O5, Al2O3, polymer dielectric resist with or without fillers or fibers, low temperature (<250° C.) curable polymer photoresist, such as BCB, PBO, or epoxy based photosensitive polymer dielectric, or other material having similar structural and insulating properties. A portion of insulating layer 432 is removed by an exposure or development process, LDA, etching, or other suitable process to form openings over conductive layer 232 of semiconductor die 224.

An electrically conductive layer or RDL 434 is formed over insulating layer 432 using a patterning and metal deposition process such as sputtering, electrolytic plating, and electroless plating. Conductive layer 434 can be one or more layers of Al, Ti, TiW, Cu, Sn, Ni, Au, Ag, W, or other suitable electrically conductive material. One portion of conductive layer 434 is electrically connected to contact pads 232 of semiconductor die 224. Other portions of conductive layer 434 can be electrically common or electrically isolated depending on the design and function of semiconductor die 224.

An insulating or passivation layer 436 is formed over insulating layer 432 and conductive layer 434 using PVD, CVD, printing, slit coating, spin coating, spray coating, injection coating, lamination, sintering, or thermal oxidation. Insulating layer 436 contains one or more layers of SiO2, Si3N4, SiON, Ta2O5, Al2O3, polymer dielectric resist with or without fillers or fibers, low temperature (<250° C.) curable polymer photoresist, such as BCB, PBO, or epoxy based photosensitive polymer dielectric, or other material having similar structural and insulating properties. A portion of insulating layer 436 can be removed by an exposure or development process, LDA, etching, or other suitable process to expose conductive layer 434.

An electrically conductive layer 438 is formed over the exposed portion of conductive layer 434 and over insulating layer 436 after final repassivation using PVD, CVD, evaporation, electrolytic plating, electroless plating, or other suitable metal deposition process. Conductive layer 438 can be Al, Ti, TiW, Cu, Sn, Ni, Au, Ag, W, or other suitable electrically conductive material. Conductive layer 438 operates as a UBM electrically connected to conductive layer 434. UBM 438 can be a multi-metal stack with adhesion layer, barrier layer, and seed or wetting layer. The adhesion layer is formed over conductive layer 434 and can be TiN, Ti, TiW, Al, or Cr. The barrier layer is formed over the adhesion layer and can be TaN, NiV, Pt, Pd, Ni, TiW, Ti, or CrCu. The barrier layer inhibits the diffusion of Cu into the active area of semiconductor die 224. The seed layer is formed over the barrier layer and can be Cu, Ni, NiV, Au, or Al. UBM 438 provides a low resistive interconnect to conductive layer 434, as well as a barrier to solder diffusion and seed layer for solder wettability.

An electrically conductive bump material is deposited over conductive layer 438 using an evaporation, electrolytic plating, electroless plating, ball drop, or screen printing process. In one embodiment, the bump material is deposited with a ball drop stencil, i.e., no mask required. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 438 using a suitable attachment or bonding process. In one embodiment, the bump material is reflowed by heating the material above its melting point to form balls or bumps 440. In some applications, bumps 440 are reflowed a second time to improve electrical contact to conductive layer 438. Bumps 440 can also be compression bonded or thermocompression bonded to conductive layer 438. Bumps 440 represent one type of interconnect structure that can be formed over conductive layer 438. The interconnect structure can also use bond wires, conductive paste, stud bump, micro bump, or other electrical interconnect.

In FIG. 18f, a backgrinding or support tape 450 is applied over interconnect structure 430 and in contact with insulating layer 436 and bumps 440. A portion of encapsulant 428 is removed in a grinding operation with grinder 452 to planarize the surface of encapsulant 428 and expose back surface 228 of semiconductor die 224. A chemical etch or CMP process can also be used to planarize encapsulant 428 and to remove mechanical damage resulting from the grinding operation. The removal of a portion of encapsulant 428 leaves new back surface 454 of encapsulant 428.

FIG. 18g shows reconstituted wafer 424 after the backgrinding process. Back surface 228 of semiconductor die 224 is exposed by the backgrinding operation. Surface 454 of encapsulant 428 and back surface 228 of semiconductor die 224 may undergo a polishing step to remove damage to base material 222 of semiconductor die 224.

A TIM 458 is deposited over back surface 228 of semiconductor die 224 and over surface 454 of encapsulant 428. TIM 458 is disposed over the individual semiconductor packages within reconstituted wafer 424. TIM 458 is a thermal epoxy, thermal epoxy resin, thermal conductive paste, aluminum oxide, zinc oxide, boron nitride, pulverized silver, or thermal grease. Alternatively, TIM 458 includes an electrically and thermally conductive material, such as Al, Cu, Sn, Ni, Au, Ag, or other suitable conductive material. TIM 458 may be electrically connected to interconnect structure 430 through semiconductor die 224 or a conductive via formed through encapsulant 428 or stiffening layer 426.

In FIG. 18h, a heat spreader or heat sink 460 is positioned over and mounted to TIM 458 over back surface 228 of semiconductor die 224. Heat spreader 460 can be Cu, Al, or other material with high thermal conductivity (60 W/m·K or greater). A plurality of individual heat spreaders 460 is disposed over reconstituted wafer 424. Each semiconductor package includes an individual heat spreader 460 disposed over TIM 458. TIM 458 is cured to attach heat spreader 460 to TIM 458 and to semiconductor die 224 and encapsulant 428. TIM 458 and heat spreader 460 form a thermally conductive path that aids with distribution and dissipation of heat generated by semiconductor die 224 and improves the thermal performance of semiconductor die 224. In one embodiment, heat spreader 460 includes a thermal conductivity of 60 W/m·K or greater. In another embodiment, heat spreader 460 is electrically and thermally connected to TIM 458 and interconnect structure 430.

FIG. 18i shows a plan view of reconstituted wafer 424 from FIG. 18h. Heat spreader 460 is disposed over a central area of each semiconductor package and over semiconductor die 224 and stiffening layer 426. In one embodiment, heat spreader 460 is a continuous solid structure. In another embodiment, heat spreader 460 includes a mesh structure, a leaf structure, or other shape shown in FIGS. 15a-15d. In yet another embodiment, heat spreader 460 includes a combination stiffener and heat spreader, as shown in FIGS. 13b-13d. The effective thermal conductivity of heat spreader 460 remains approximately 60 W/m·K or greater.

Figure 18J:
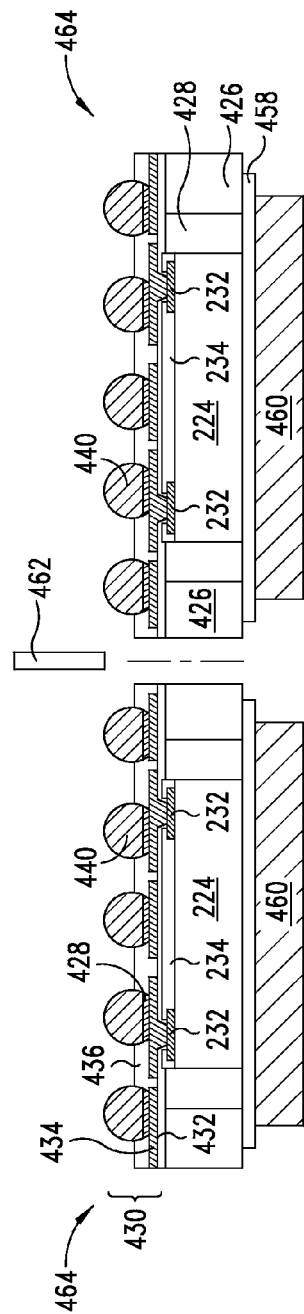

In FIG. 18j, reconstituted wafer 424 is singulated through encapsulant 428, stiffener 426, and interconnect structure 430 with saw blade or laser cutting tool 462 into individual semiconductor packages, FO-WLCSP 464. FO-WLCSPs 464 undergo electrical testing before or after singulation. In one embodiment, FO-WLCSP 464 is a multi-die package with each semiconductor die 224 having the same height. In another embodiment, FO-WLCSP 464 is a multi-die package and includes semiconductor die 224 having different heights. In yet another embodiment, FO-WLCSP 464 includes a single semiconductor die 224 rather than multiple semiconductor die 224.

Figure 19:
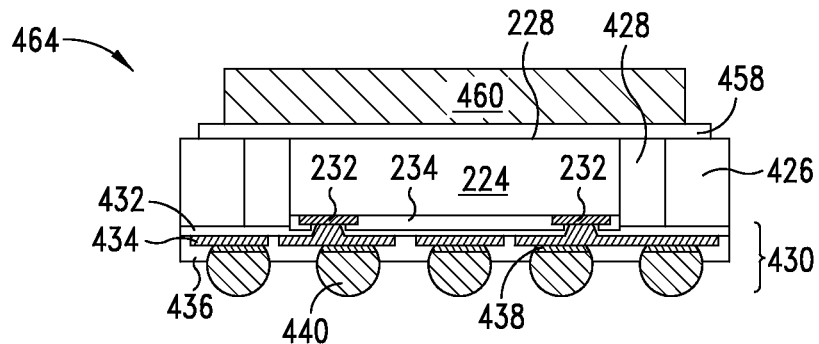
FIG. 19 illustrates a FO-WLCSP including a stiffener and heat spreader according to FIGS. 18a-18j.

FIG. 19 shows FO-WLCSP 464 from FIGS. 18a-18j after singulation. FO-WLCSP 464 includes one or more semiconductor die 224 embedded in encapsulant 428. Stiffening layer 426 is disposed adjacent to semiconductor die 224. Interconnect structure 430 is formed over active surface 230 of semiconductor die 224 and over encapsulant 428 to provide electrical interconnect extending outside a footprint of semiconductor die 224. TIM 458 is formed over a portion of semiconductor die 224 and encapsulant 428. Heat spreader 460 is disposed over TIM 458. TIM 458 and heat spreader 460 form a thermally conductive path that aids with distribution and dissipation of heat generated by semiconductor die 224 and improves the thermal performance of FO-WLCSP 464.

Stiffening layer 426 and heat spreader 460 provide structural support and increase the strength of FO-WLCSP 464. The position or configuration of stiffening layer 426 provides structural support for each semiconductor package, while the material of stiffening layer 426 reduces warpage of FO-WLCSP 464. The combination of stiffening layer 426, including a low CTE, and heat spreader 460 including high thermal conductivity provides a balance of warpage and thermal performance. The warpage effect caused by the high CTE (greater than 14 ppm/° C.) of heat spreader 460 is mitigated by the lower CTE of stiffening layer 426. Stiffening layer 426 including a low CTE (less than 6 ppm/° C.) reduces the effective CTE of FO-WLCSP 464. Thus, stiffening layer 426 improves warpage behavior of FO-WLCSP 464, while heat spreader 460, including a thermal conductivity of 60 W/m·K or greater, maintains the beneficial heat dissipation characteristics for FO-WLCSP 464. FO-WLCSP 464 exhibits balanced thermal performance with good warpage behavior and thermal conductivity. FO-WLCSP 464 avoids the need for expensive materials for heat dissipation, and therefore reduces the cost to manufacture a high performance FO-WLCSP.

Figure 20:
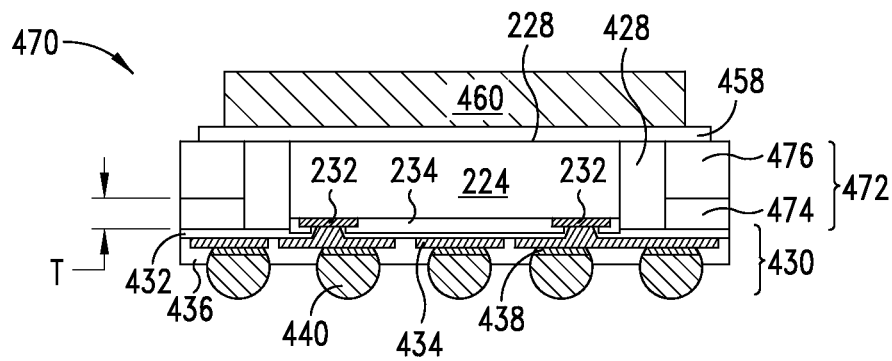
FIG. 20 illustrates a FO-WLCSP including a composite stiffener and a heat spreader.

FIG. 20 shows an alternative semiconductor package or FO-WLCSP 470 including a composite stiffener or stiffening layer 472. Composite stiffener 472 includes an insulating layer 474 and a stiffening layer 476 formed over insulating layer 474. Insulating or dielectric layer 474 is formed adjacent to semiconductor die 224 over carrier 420 and interface layer 422 using PVD, CVD, printing, slit coating, spin coating, spray coating, injection coating, lamination, sintering, or thermal oxidation. Insulating layer 474 contains one or more layers of SiO2, Si3N4, SiON, Ta2O5, Al2O3, polymer dielectric resist with or without fillers or fibers, low temperature (<250° C.) curable polymer photoresist, such as BCB, PBO, epoxy based photosensitive polymer dielectric, prepreg with a combination of phenolic cotton paper, epoxy, resin, woven glass, matte glass, polyester, and other reinforcement fibers or fabrics, PCB board material with core layer, or other material having similar structural and insulating properties. Insulating layer 474 may include a single polymer resist material or may include a composite material such as a resin with filler or a resin with filler and fiber. In one embodiment, insulating layer 474 includes a CTE of 3 ppm/° C. or greater. Insulating layer 474 includes a thickness T of 15µ or greater. In another embodiment, insulating layer 474 is optional.

Stiffening layer 476 is formed over insulating layer 474. Alternatively, composite stiffener 472 is pre-formed with stiffening layer 476 over insulating layer 474 and is mounted to interface layer 422 over carrier 420 prior to or after mounting semiconductor die 224. Stiffening layer 476 may be a metal having a low thermal conductivity or another material having low thermal conductivity. Stiffening layer 476 may be a sacrificial base material such as silicon, polymer, beryllium oxide, glass, or other suitable low-cost, rigid material. Stiffening layer 476 may be ferrite, carbonyl iron, ceramic, or a discrete component. In one embodiment, stiffening layer 476 includes a CTE of 5 ppm/° C. or less.

Composite stiffener 472 is disposed adjacent to semiconductor die 224 or in a peripheral region of semiconductor die 224. In one embodiment, composite stiffener 472 is disposed within semiconductor package 470 according to the embodiments described with respect to FIG. 18d. Composite stiffener 472 and semiconductor die 224 are embedded in encapsulant 428. Interconnect structure 430 is formed over active surface 230 of semiconductor die 224 and over encapsulant 428 and composite stiffener 472 to provide electrical interconnect extending outside a footprint of semiconductor die 224. Back surface 228 of semiconductor die 224 and a surface of composite stiffener 472 may be exposed with respect to encapsulant 428. TIM 458 is formed over a portion of semiconductor die 224, encapsulant 428, and composite stiffener 472. Heat spreader 460 is mounted to TIM 458 over back surface 228 of semiconductor die 224. TIM 458 is cured to attach heat spreader 460 to TIM 458 and to semiconductor die 224, composite stiffener 472, and encapsulant 428. TIM 458 and heat spreader 460 form a thermally conductive path that aids with distribution and dissipation of heat generated by semiconductor die 224 and improves the thermal performance of semiconductor die 224. In one embodiment, heat spreader 460 includes a thermal conductivity of 60 W/m·K or greater.

Composite stiffener 472 and heat spreader 460 provide structural support and increase the strength of FO-WLCSP 470. The position or configuration of composite stiffener 472 provides structural support for each semiconductor package, while the material of composite stiffener 472 reduces warpage of FO-WLCSP 470. Insulating layer 474 provides stress relief at a surface of FO-WLCSP 470 opposite heat spreader 460, thereby improving board level reliability performance and reducing damage to solder joints during functional testing, such as thermal cycling. The combination of composite stiffener 472, including a low CTE, and heat spreader 460 including high thermal conductivity provides a balance of warpage and thermal performance. The warpage effect caused by the high CTE (greater than 14 ppm/° C.) of heat spreader 460 is mitigated by the lower CTE of composite stiffener 472. Composite stiffener 472 including a low CTE core stiffening layer 476 (less than 5 ppm/° C.) reduces the effective CTE of FO-WLCSP 470. Thus, composite stiffener 472 improves warpage behavior of FO-WLCSP 470, while heat spreader 460, including a thermal conductivity of 60 W/m·K or greater, maintains the beneficial heat dissipation characteristics for FO-WLCSP 470. FO-WLCSP 470 exhibits balanced thermal performance with good warpage behavior and thermal conductivity. FO-WLCSP 470 avoids the need for expensive materials for heat dissipation, and therefore reduces the cost to manufacture a high performance FO-WLCSP.

Figure 21:
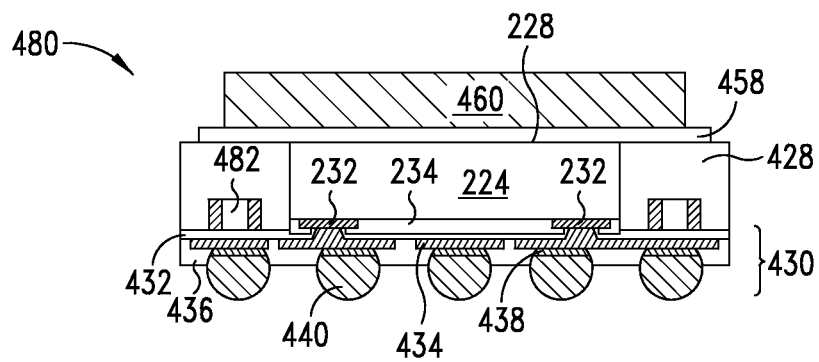
FIG. 21 illustrates a FO-WLCSP including a discrete component and a heat spreader.

FIG. 21 shows an alternative semiconductor package or FO-WLCSP 480 including a component as a stiffener. Component or discrete component 482 is mounted to interface layer 422 over carrier 420 and adjacent to semiconductor die 224 prior to depositing encapsulant 428. Component 482 may include, for example, another semiconductor die, a ferrite, a passive device, a discrete semiconductor device, another semiconductor package. The discrete components can be filters, discrete passive devices, such as inductors, resistors, or capacitors, or other discrete devices. Alternatively, component 482 includes a ceramic element, such as a positive temperature coefficient (PTC). Component 482 is disposed adjacent to semiconductor die 224 or in a peripheral region of semiconductor die 224. Component 482 and semiconductor die 224 are embedded in encapsulant 428. Interconnect structure 430 is formed over active surface 230 of semiconductor die 224 and over encapsulant 428 to provide electrical interconnect extending outside a footprint of semiconductor die 224. TIM 458 is formed over a portion of semiconductor die 224 and encapsulant 428. Heat spreader 460 is mounted to TIM 458 over back surface 228 of semiconductor die 224. TIM 458 is cured to attach heat spreader 460 to TIM 458 and to semiconductor die 224 and encapsulant 428. TIM 458 and heat spreader 460 form a thermally conductive path that aids with distribution and dissipation of heat generated by semiconductor die 224 and improves the thermal performance of semiconductor die 224. In one embodiment, heat spreader 460 includes a thermal conductivity of 60 W/m·K or greater.

Component 482 operates as a stiffener within FO-WLCSP 480 and reduces the effective CTE of FO-WLCSP 480. Component 482, including a low CTE, and heat spreader 460 including high thermal conductivity provides a balance of warpage and thermal performance within FO-WLCSP 480. The warpage effect caused by the high CTE (greater than 14 ppm/° C.) of heat spreader 460 is mitigated by the lower CTE of component 482. Component 482 includes a low CTE and reduces the effective CTE of FO-WLCSP 480. Thus, component 482 improves warpage behavior of FO-WLCSP 480, while heat spreader 460, including a thermal conductivity of 60 W/m·K or greater, maintains the beneficial heat dissipation characteristics for FO-WLCSP 480. FO-WLCSP 480 exhibits balanced thermal performance with good warpage behavior and thermal conductivity. FO-WLCSP 480 avoids the need for expensive materials for heat dissipation, and therefore reduces the cost to manufacture a high performance FO-WLCSP.

Figure 22:
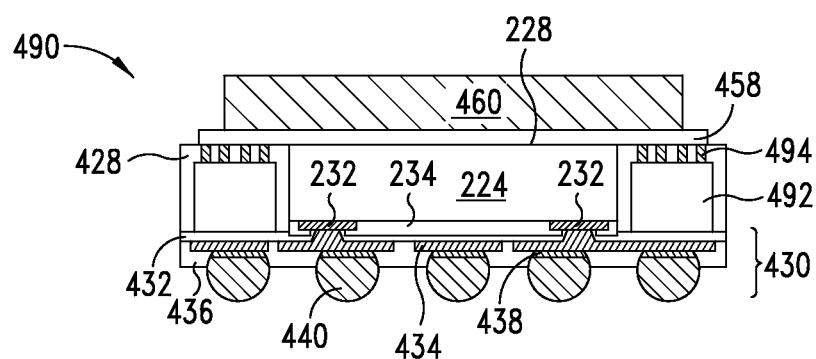
FIG. 22 illustrates a FO-WLCSP including a stiffening layer and a heat spreader.

FIG. 22 shows an alternative semiconductor package or FO-WLCSP 490 including a stiffening layer and inductor. Stiffening layer 492 is formed adjacent to semiconductor die 224 over interface layer 422 over carrier 420 prior to depositing encapsulant 428. Alternatively, stiffening layer 492 is pre-formed and mounted to interface layer 422 over carrier 420 prior to or after mounting semiconductor die 224. Stiffening layer 492 may be ferrite, carbonyl iron, ceramic, or a discrete component. Alternatively, stiffening layer 492 may be a metal having a low thermal conductivity, another material having low thermal conductivity, a sacrificial base material such as silicon, polymer, beryllium oxide, glass, or other suitable low-cost, rigid material. In one embodiment, stiffening layer 492 includes a ferrite material.

An electrically conductive layer 494 is formed over stiffening layer 492 using a patterning and metal deposition process such as sputtering, electrolytic plating, and electroless plating. Conductive layer 494 can be one or more layers of Al, Ti, TiW, Cu, Sn, Ni, Au, Ag, W, or other suitable electrically conductive material. In one embodiment, conductive layer 494 is patterned, wound, or coiled in plan-view to produce or exhibit the desired properties of an inductor. Conductive layer 494 over stiffening layer 492 improves the Q-value of the inductor.

Conductive layer 494, stiffening layer 492, and semiconductor die 224 are embedded in encapsulant 428. Interconnect structure 430 is formed over active surface 230 of semiconductor die 224 and over encapsulant 428 and stiffening layer 492 to provide electrical interconnect extending outside a footprint of semiconductor die 224. TIM 458 is formed over a portion of semiconductor die 224 and encapsulant 428. Heat spreader 460 is mounted to TIM 458 over back surface 228 of semiconductor die 224. TIM 458 is cured to attach heat spreader 460 to TIM 458 and to semiconductor die 224 and encapsulant 428. TIM 458 and heat spreader 460 form a thermally conductive path that aids with distribution and dissipation of heat generated by semiconductor die 224 and improves the thermal performance of semiconductor die 224. In one embodiment, heat spreader 460 includes a thermal conductivity of 60 W/m·K or greater.

Stiffening layer 492 and heat spreader 460 provide structural support and increase the strength of FO-WLCSP 490. The position or configuration of stiffening layer 492 provides structural support for each semiconductor package, while the material of stiffening layer 492 reduces warpage of FO-WLCSP 490. Stiffening layer 492, including a low CTE, and heat spreader 460 including high thermal conductivity provides a balance of warpage and thermal performance within FO-WLCSP 490. The warpage effect caused by the high CTE (greater than 14 ppm/° C.) of heat spreader 460 is mitigated by the lower CTE of stiffening layer 492. Stiffening layer 492 includes a low CTE and reduces the effective CTE of FO-WLCSP 490. Thus, stiffening layer 492 improves warpage behavior of FO-WLCSP 490, while heat spreader 460, including a thermal conductivity of 60 W/m·K or greater, maintains the beneficial heat dissipation characteristics for FO-WLCSP 490. FO-WLCSP 490 exhibits balanced thermal performance with good warpage behavior and thermal conductivity. FO-WLCSP 490 avoids the need for expensive materials for heat dissipation, and therefore reduces the cost to manufacture a high performance FO-WLCSP.

Figure 23:
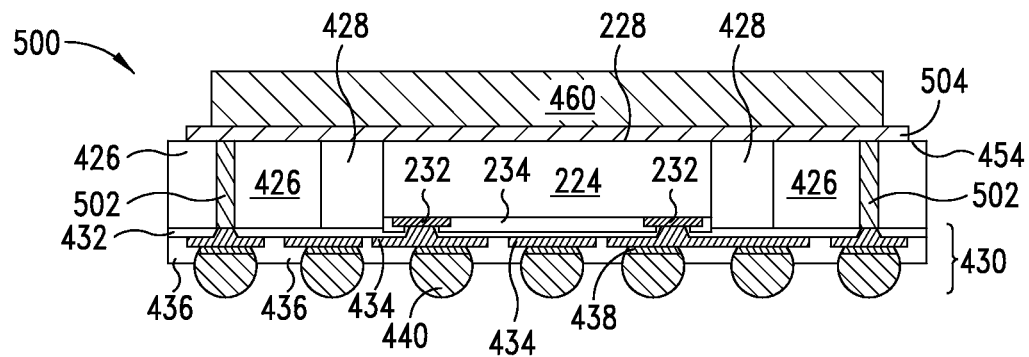
FIG. 23 illustrates a FO-WLCSP including a conductive via formed through a stiffening layer.

FIG. 23 shows an alternative semiconductor package or FO-WLCSP 500 including a plurality of conductive vias or conductive pillars 502 formed through a stiffening layer. Stiffening layer 426 is formed adjacent to semiconductor die 224 over interface layer 422 over carrier 420 prior to depositing encapsulant 428. Stiffening layer 426 may be a metal having a low thermal conductivity, another material having low thermal conductivity, a sacrificial base material such as silicon, polymer, beryllium oxide, glass, or other suitable low-cost, rigid material. A plurality of through vias is formed through stiffening layer 426 using laser drilling, mechanical drilling, or DRIE. The vias are filled with Al, Cu, Sn, Ni, Au, Ag, Ti, W, or other suitable electrically conductive material using electrolytic plating, electroless plating process, or other suitable deposition process to form z-direction vertical interconnect conductive vias 502. Alternatively, stiffening layer 426 is pre-formed with conductive vias or conductive pillars 502 and mounted to interface layer 422 over carrier 420 prior to or after mounting semiconductor die 224. Interconnect structure 430 is formed over active surface 230 of semiconductor die 224 and over encapsulant 428 and stiffening layer 426 to provide electrical interconnect extending outside a footprint of semiconductor die 224. Interconnect structure 430 is electrically connected to conductive vias 502. Back surface 228 of semiconductor die 224 and a surface of stiffening layer 426 with conductive vias 502 may be exposed with respect to encapsulant 428.

A TIM 504 is deposited over back surface 228 of semiconductor die 224, over surface 454 of encapsulant 256, and over stiffening layer 426. TIM 504 includes a thermally and electrically conductive material, such as Al, Cu, Sn, Ni, Au, Ag, or other suitable conductive material. Heat spreader or heat sink 460 is positioned over and mounted to TIM 504 over back surface 228 of semiconductor die 224. Heat spreader 460 can be Cu, Al, or other material with high thermal conductivity (60 W/m·K or greater). Heat spreader 460 may include a combination stiffener and heat spreader, as shown in FIGS. 13b-13d, or a uniform material including a structure according to FIGS. 15a-15d. TIM 504 is cured to attach heat spreader 460 to TIM 504 and to semiconductor die 224, encapsulant 428, and stiffening layer 426. TIM 504 and heat spreader 460 form a thermally conductive path that aids with distribution and dissipation of heat generated by semiconductor die 224 and improves the thermal performance of semiconductor die 224. In one embodiment, TIM 504 forms an electrically conductive path between heat spreader 460 and conductive vias 502 to interconnect structure 430 or to back surface 228 of semiconductor die 224. The electrically conductive path may connect heat spreader 460 to ground through interconnect structure 430. In another embodiment, TIM 504 thermally and electrically connects heat spreader 460 to conductive vias 502.

Stiffening layer 426 and heat spreader 460 provide structural support and increase the strength of FO-WLCSP 500. The position or configuration of stiffening layer 426 provides structural support for each semiconductor package, while the material of stiffening layer 426 reduces warpage of FO-WLCSP 500. The combination of stiffening layer 426, including a low CTE, and heat spreader 460 including high thermal conductivity provides a balance of warpage and thermal performance. The warpage effect caused by the high CTE (greater than 14 ppm/° C.) of heat spreader 460 is mitigated by the lower CTE of stiffening layer 426. Stiffening layer 426 including a low CTE (less than 6 ppm/° C.) reduces the effective CTE of FO-WLCSP 500. Thus, stiffening layer 426 improves warpage behavior of FO-WLCSP 500, while heat spreader 460, including a thermal conductivity of 60 W/m·K or greater, maintains the beneficial heat dissipation characteristics for FO-WLCSP 500. FO-WLCSP 500 exhibits balanced thermal performance with good warpage behavior and thermal conductivity. FO-WLCSP 500 avoids the need for expensive materials for heat dissipation, and therefore reduces the cost to manufacture a high performance FO-WLCSP.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a semiconductor die;
   depositing an encapsulant over the semiconductor die;
   forming a stiffening layer over the semiconductor die and encapsulant; and
   forming a heat spreader over the semiconductor die.

2. The method of claim 1, further including forming the stiffening layer over an edge portion of the encapsulant.

3. The method of claim 1, further including forming the heat spreader over a central portion of the encapsulant.

4. The method of claim 1, further including forming an interconnect structure over the semiconductor die and encapsulant.

5. The method of claim 1, further including forming a recess in the heat spreader, the recess disposed along an edge of the heat spreader.

6. The method of claim 1, further including:
   forming an opening in the stiffening layer; and
   disposing the heat spreader within the opening in the stiffening layer.

7. A semiconductor device, comprising:
   a first semiconductor die;
   an encapsulant deposited over the first semiconductor die;
   a stiffening layer disposed over the encapsulant; and
   a heat spreader disposed over the first semiconductor die.

8. The semiconductor device of claim 7, further including a plurality of openings formed in the heat spreader.

9. The semiconductor device of claim 7, wherein the stiffening layer is disposed over an edge portion of the encapsulant.

10. The semiconductor device of claim 7, wherein the stiffening layer is disposed adjacent to the heat spreader.

11. The semiconductor device of claim 7, wherein a coefficient of thermal expansion (CTE) of the stiffening layer is less than a CTE of the heat spreader.

12. The semiconductor device of claim 7, further including a second semiconductor die disposed adjacent to the first semiconductor die.

13. A semiconductor device, comprising:
   a first semiconductor die;
   an encapsulant deposited over the first semiconductor die;
   a thermal interface material formed over the first semiconductor die;
   a heat spreader disposed over the first semiconductor die and encapsulant, the heat spreader including an opening extending to the thermal interface material; and
   a stiffening layer formed over the encapsulant.

14. The semiconductor device of claim 13, further including a recess formed in the heat spreader along an edge of the heat spreader.

15. The semiconductor device of claim 13, further including the stiffening layer formed adjacent to the first semiconductor die.

16. The semiconductor device of claim 13, wherein the stiffening layer includes a metal, a ferrite material, a ceramic material, or a semiconductor material.

17. The semiconductor device of claim 13, further including a second semiconductor die disposed adjacent to the first semiconductor die.

18. A semiconductor device, comprising:
   a first semiconductor die;
   a stiffening layer disposed over the first semiconductor die;
   a heat spreader disposed over the first semiconductor die; and
   a thermal interface material formed over the semiconductor die, the stiffening layer and heat spreader mounted to the thermal interface material.

19. The semiconductor device of claim 18, wherein the heat spreader further includes an opening formed through the heat spreader.

20. The semiconductor device of claim 18, wherein the heat spreader further includes a recess formed along an edge of the heat spreader.

21. The semiconductor device of claim 18, further including a second semiconductor die disposed adjacent to the first semiconductor die.

* * * * *